(12) United States Patent
Kawano

(10) Patent No.: US 11,519,948 B2
(45) Date of Patent: Dec. 6, 2022

(54) MEASURING DEVICE AND METHOD

(71) Applicant: TOKYO ELECTRON LIMITED, Tokyo (JP)

(72) Inventor: Daisuke Kawano, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 167 days.

(21) Appl. No.: 16/876,078

(22) Filed: May 17, 2020

(65) Prior Publication Data

US 2020/0363459 A1    Nov. 19, 2020

(30) Foreign Application Priority Data

May 17, 2019 (JP) .............................. JP2019-093550
Oct. 31, 2019 (JP) .............................. JP2019-198602

(51) Int. Cl.
*G01R 27/26* (2006.01)
*G01K 13/00* (2021.01)
(Continued)

(52) U.S. Cl.
CPC ......... *G01R 27/2605* (2013.01); *G01K 13/00* (2013.01); *H01L 21/67248* (2013.01); *H01J 37/32899* (2013.01); *H01J 2237/24585* (2013.01); *H01J 2237/334* (2013.01); *H01L 21/67069* (2013.01); *H01L 21/67167* (2013.01); *H01L 21/67259* (2013.01)

(58) Field of Classification Search
CPC ................ G01R 27/2605; G01K 13/00; H01L 21/67248; H01L 21/67069; H01L 21/67167; H01L 21/67259; H01J 37/32899; H01J 2237/24585; H01J 2237/334
USPC ... 324/76.11–76.83, 459, 600, 649, 658, 663
See application file for complete search history.

(56) References Cited

U.S. PATENT DOCUMENTS

2016/0211853 A1\* 7/2016 Fukuzawa ................. H03L 1/00
2017/0194965 A1\* 7/2017 Yonezawa ............... H03L 7/099
(Continued)

FOREIGN PATENT DOCUMENTS

JP    2018-169198 A    11/2018

*Primary Examiner* — Raul J Rios Russo
(74) *Attorney, Agent, or Firm* — Weihrouch IP

(57) ABSTRACT

A measuring device is provided. The measuring device includes a base substrate, sensor electrodes, a temperature sensor, a high frequency oscillator, C/V conversion circuits for generating voltage signals corresponding to electrostatic capacitances of the sensor electrodes, an A/D converter for converting the voltage signals to digital values, a calculation unit for calculating measurement values indicating the electrostatic capacitances based on the digital values, and phase control circuits connected between the sensor electrodes and the high-frequency oscillator. Each of the conversion circuits includes an operational amplifier, and the high-frequency oscillator is connected to a non-inverting input terminal of the amplifier and is connected to an inverting input terminal thereof through a corresponding phase control circuit. The calculation unit stores parameters for setting admittances of the phase control circuits in association with temperatures and adjusts the admittances of the phase control circuits using a parameter associated with a detected temperature.

19 Claims, 13 Drawing Sheets

(51) Int. Cl.
*H01L 21/67* (2006.01)
*H01J 37/32* (2006.01)

(56) References Cited

U.S. PATENT DOCUMENTS

2017/0279452 A1* 9/2017 Hayashi .................... H03J 7/08
2019/0326855 A1* 10/2019 Uno ........................ H03L 1/023

* cited by examiner

MEASURING DEVICE AND METHOD

CROSS-REFERENCE TO RELATED APPLICATIONS

This application claims priority to Japanese Patent Application Nos. 2019-093550 and 2019-198602, respectively filed on May 17, 2019 and Oct. 31, 2019, the entire contents of which are incorporated herein by reference.

TECHNICAL FIELD

The present disclosure relates to a measuring device and a measuring method.

BACKGROUND

Japanese Patent Application Publication No. 2018-169198 discloses an electrostatic capacitance measuring device. The measuring device includes a base substrate, a first sensor, second sensors, and a circuit board. The first sensor has a first electrode disposed along an edge of the base substrate. The second sensors have second electrodes fixed on the base substrate. The circuit board is mounted on the base board and is connected to the first sensor and the second sensors. The circuit board supplies high-frequency signals to the first electrode and the second electrodes to obtain a first measurement value corresponding to the electrostatic capacitance from a voltage amplitude at the first electrode and second measurement values corresponding to the electrostatic capacitances from voltage amplitudes at the second electrodes. The measuring device has reference surfaces. The reference surfaces are fixed in the measuring device and respectively face the second electrodes.

The present disclosure provides a technique for suppressing changes in a measurement value of an electrostatic capacitance due to changes in a temperature environment.

SUMMARY

In accordance with an aspect of the present disclosure, there is provided a measuring device including: a disc-shaped base substrate; a plurality of sensor electrodes disposed at the base substrate; a temperature sensor disposed at the base substrate; a high frequency oscillator configured to apply a high frequency signal to the sensor electrodes; a plurality of C/V conversion circuits configured to generate a plurality of voltage signals respectively corresponding to a plurality of electrostatic capacitances of the sensor electrodes; an A/D converter configured to convert the voltage signals outputted from the C/V conversion circuits to a plurality of digital values; a calculation unit configured to calculate a plurality of measurement values indicating the electrostatic capacitances of the sensor electrodes, based on the digital values outputted from the A/D converter; and a plurality of phase control circuits connected between the sensor electrodes and the high-frequency oscillator. Further, each of the C/V conversion circuits includes an amplification circuit having an operational amplifier. The high-frequency oscillator is connected to a non-inverting input terminal of the operational amplifier to input the high-frequency signal to the non-inverting input terminal, and is connected to an inverting input terminal of the operational amplifier through a corresponding phase control circuit among the plurality of phase control circuits. The calculation unit stores a plurality of parameters for setting admittances of the phase control circuits in association with a plurality of temperatures in order to adjust reference points of the voltage signals outputted from the C/V conversion circuits at the respective temperatures, and adjusts the admittances of the phase control circuits using a parameter associated with a temperature detected by the temperature sensor among the plurality of parameters.

BRIEF DESCRIPTION OF THE DRAWINGS

The objects and features of the present disclosure will become apparent from the following description of embodiments, given in conjunction with the accompanying drawings, in which.

DETAILED DESCRIPTION

Figure 1:
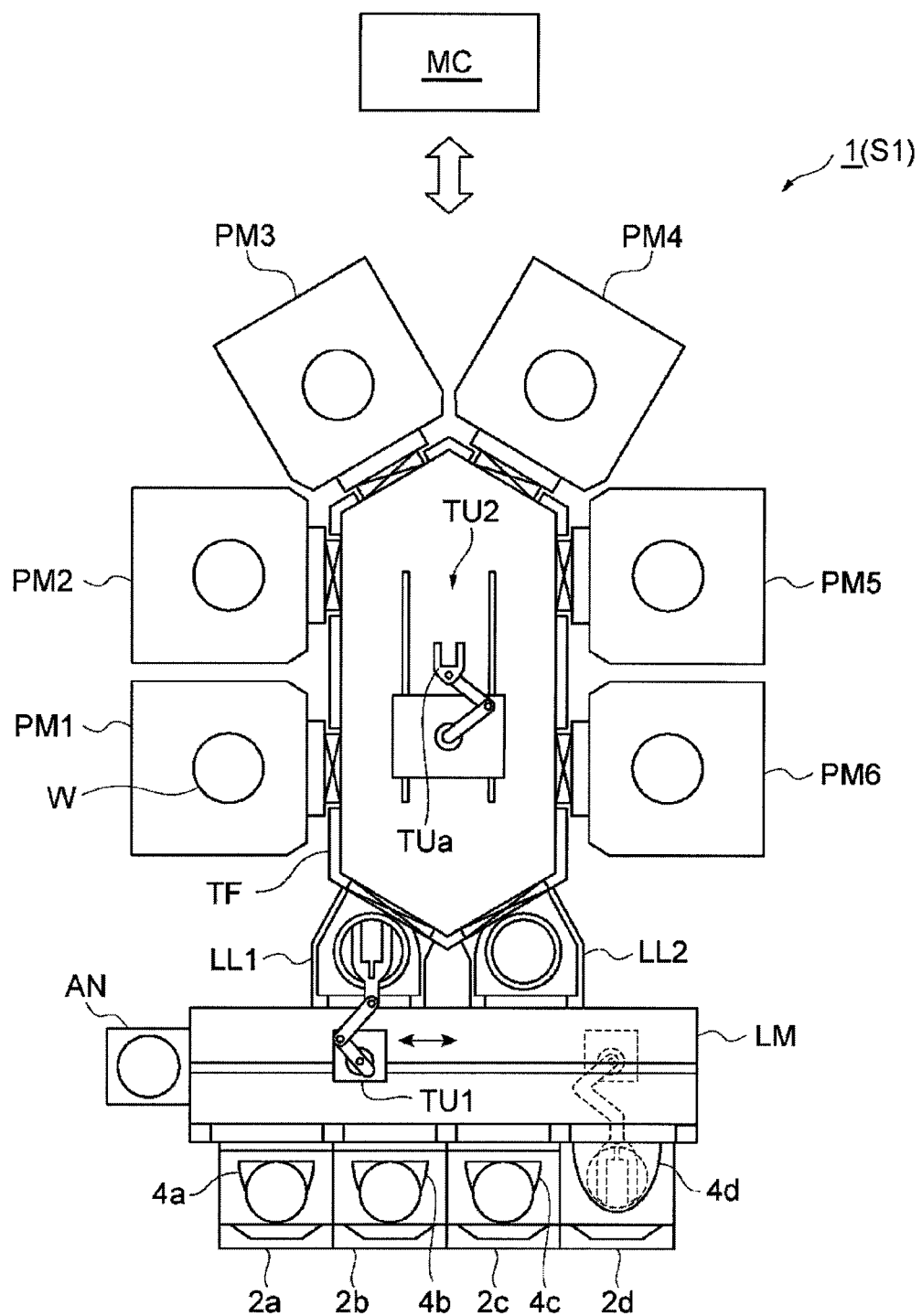
FIG. 1 shows a processing system.

Hereinafter, various embodiments will be described.

In one exemplary embodiment, there is provided a measuring device. The measuring device includes a disc-shaped base substrate; a plurality of sensor electrodes disposed at the base substrate; a temperature sensor disposed at the base substrate; a high frequency oscillator configured to apply a high frequency signal to the sensor electrodes; a plurality of C/V conversion circuits configured to generate a plurality of voltage signals respectively corresponding to a plurality of electrostatic capacitances of the sensor electrodes; an A/D converter configured to convert the voltage signals outputted from the C/V conversion circuits to a plurality of digital values; a calculation unit configured to calculate a plurality of measurement values indicating the electrostatic capacitances of the sensor electrodes, based on the digital values outputted from the A/D converter; and a plurality of phase control circuits connected between the sensor electrodes and the high-frequency oscillator. Further each of the C/V conversion circuits includes an amplification circuit having an operational amplifier. Further, the high-frequency oscillator is connected to a non-inverting input terminal of the operational amplifier to input the high-frequency signal to the non-inverting input terminal, and the high-frequency oscillator is also connected to an inverting input terminal of the operational amplifier through a corresponding phase control circuit among the plurality of phase control circuits. Further, the calculation unit stores a plurality of parameters for setting admittances of the phase control circuits in association with a plurality of temperatures in order to adjust reference points of the voltage signals outputted from the C/V conversion circuits at the respective temperatures, and the calculation unit adjusts the admittances of the phase control circuits using a parameter associated with a temperature detected by the temperature sensor among the plurality of parameters.

In the measuring device of the above embodiment, the high-frequency oscillator is connected to the non-inverting input terminal of the operational amplifier in order to input the high-frequency signal to the non-inverting input terminal, and is connected to the inverting input terminal of the operational amplifier through the phase control circuit. Therefore, the magnitudes of the voltage signal outputted from the C/V conversion circuits can be adjusted by adjusting the admittances of the phase control circuits. The magnitudes of the voltage signals outputted from the C/V conversion circuits may change depending on an ambient temperature. Since the calculation unit adjusts the admittances using the parameter corresponding to the temperature detected by the temperature sensor, the changes in the magnitudes of the voltage signals due to the temperature can be suppressed. Further, since the calculation unit stores parameters corresponding to the phase control circuits, it is possible to suppress the variation among the voltage signals due to the difference between the sensor electrodes.

In one exemplary embodiment, the reference point adjustment may be zero point adjustment. The zero point adjustment may be performed in a state where there is no target object to be detected by the measuring device. Therefore, it is easy to set the measuring device at the time of performing the reference point adjustment.

In one exemplary embodiment, the calculation unit may store a plurality of constant groups, each including a plurality of constants associated with a plurality of temperatures, in order to suppress temperature dependence of the measurement values calculated from the digital values using a plurality of functions. The calculation unit may calculate the measurement values based on the functions using constants obtained from the constant groups depending on the temperature detected by the temperature sensor. The constants of the functions for calculating the measurement values indicating the electrostatic capacitances of the sensor electrodes based on the digital values may be changed depending on the temperature of the circuit of the measuring device. Since the calculation unit uses constants corresponding to a temperature detected by the temperature sensor, it is possible to suppress the changes in the magnitudes of the measurement values due to the temperature changes.

In another exemplary embodiment, a method for measuring electrostatic capacitances between a measuring device and a target object is provided. The method includes adjusting admittances of the phase control circuits using a parameter associated with a temperature detected by the temperature sensor, among a plurality of parameters. The plurality of parameters are pre-stored in association with a plurality of temperatures to set the admittances of the phase control circuits. The method further includes generating, by the C/V conversion circuits, the voltage signals in a state where the admittances are adjusted. The method further includes converting, by the A/D converter, the voltage signals outputted from the C/V conversion circuits into the digital values. The method further includes calculating the measurement values based on the digital values.

In one exemplary embodiment, the sensors may be disposed at an edge of the base substrate. The target object may be a focus ring surrounding the base substrate. With this configuration, the relative position between the focus ring and the measuring device can be obtained.

In one exemplary embodiment, the sensors may be disposed on a bottom surface of the base substrate. The target object may be an electrostatic chuck on which the base substrate is mounted. With this configuration, the relative position between the electrostatic chuck and the measuring device can be obtained.

Hereinafter, various embodiments will be described in detail with reference to the drawings. Like references will be given to like or corresponding parts throughout the drawings.

The measuring device according to one embodiment can be transferred by a processing system 1 serving as a transfer system S1. First, a processing system including a processing device for processing a target object, and a transfer device for transferring the target object to the processing device will be described. FIG. 1 shows an example of the processing system. The processing system 1 includes tables 2a to 2d, containers 4a to 4d, a loader module LM, an aligner AN, load-lock modules LL1 and LL2, processing modules PM1 to PM6, a transfer module TF, and a controller MC. The number of the tables 2a to 2d, the number of the containers 4a to 4d, the number of the load-lock modules LL1 and LL2, and the number of the processing modules PM1 to PM6 are not limited, and may be one or more.

The tables 2a to 2d are arranged along one edge of the loader module LM. The containers 4a to 4d are mounted on the tables 2a to 2d, respectively. Each of the containers 4a to 4d is, e.g., a FOUP (Front Opening Unified Pod). Each of the containers 4a to 4d can accommodate a target object W. The target object W has a substantially disc shape that is the same as that of a wafer.

The loader module LM has therein a chamber wall that defines a transfer space in an atmospheric pressure state. A transfer device TU1 is disposed in the transfer space. The transfer device TU1 is, e.g., a multi-joint robot, and is controlled by the controller MC. The transfer device TU1 is configured to transfer the target object W between the containers 4a to 4d and the aligner AN, between the aligner AN and the load-lock modules LL1 to LL2, and between the load-lock modules LL1 to LL2 and the containers 4a to 4d.

Figure 2:
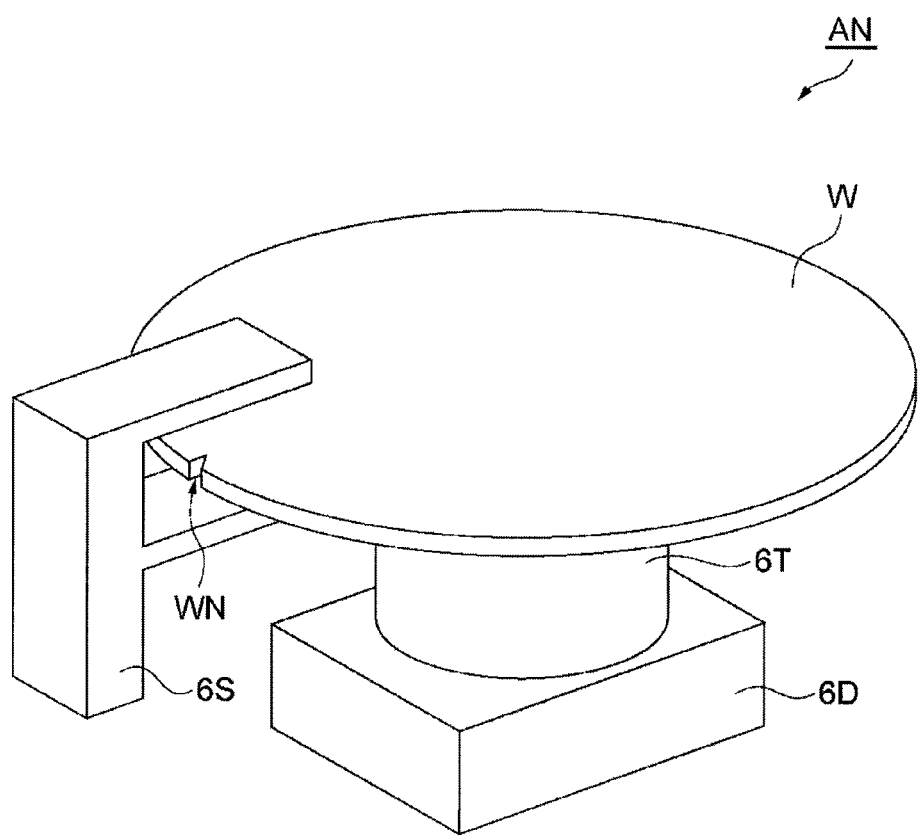
FIG. 2 is a perspective view of an example of an aligner.

The aligner AN is connected to the loader module LM. The aligner AN is configured to adjust the position of the target object W (calibration of the position). FIG. 2 is a perspective view of an example of the aligner. The aligner AN has a supporting table 6T, a driving unit 6D, and a sensor 6S. The supporting table 6T is a table that is rotatable about an axis extending in a vertical direction, and is configured to support the target object W thereon. The supporting table 6T is rotated by the driving unit 6D. The driving unit 6D is controlled by the controller MC. When the supporting table 6T is rotated by the power from the driving unit 6D, the target object W mounted on the supporting table 6T is also rotated.

The sensor 6S is an optical sensor and detects an edge of the target object W during the rotation of the target object W. The sensor 6S calculates a misalignment amount of an angular position of a notch WN (or a marker) of the target object W with respect to a reference angular position and a misalignment amount of a central position of the target object W with respect to a reference position from the detection result of the edge. The sensor 6S outputs the misalignment amount of the angular position of the notch WN and the misalignment amount of the central position of the target object W to the controller MC. The controller MC calculates the amount of rotation of the supporting table 6T for correcting the angular position of the notch WN to the reference angular position based on the misalignment amount of the angular position of the notch WN. The controller MC controls the driving unit 6D to rotate the supporting table 6T by the amount of the rotation. Accordingly, the angular position of the notch WN can be corrected to the reference angular position. Further, the controller MC controls a position of an end effector of the transfer device TU1 at the time of receiving the target object W from the aligner AN based on the misalignment amount of the central position of the target object W. Accordingly, the central position of the target object W coincides with a predetermined position on the end effector of the transfer device TU1.

Referring back to FIG. 1, the load-lock module LL1 and the load-lock module LL2 are disposed between the loader module LM and the transfer module TF. Each of the load-lock module LL1 and the load-lock module LL2 provides a preliminary decompression chamber.

The transfer module TF is airtightly connected to the load-lock module LL1 and the load-lock module LL2 through gate valves. The transfer module TF provides a depressurizable decompression chamber. The transfer unit TU2 is disposed in the decompression chamber. The transfer device TU2 is, e.g., a multi-joint robot having a transfer arm TUa, and is controlled by the controller MC. The transfer device TU2 is configured to transfer the target object W between the load-lock modules LL1 to LL2 and the processing modules PM1 to PM6, and between any two of the processing modules PM1 to PM6.

The processing modules PM1 to PM6 are airtightly connected to the transfer module TF through gate valves. Each of the processing modules PM1 to PM6 is a processing device configured to perform a dedicated processing such as plasma processing on the target object W.

The following is description of a series of operations to be performed to process the target object W in the processing system 1. The transfer device TU1 of the loader module LM extracts a target object W from any one of the containers 4a to 4d, and transfers the target object W to the aligner AN. Next, the transfer device TU1 extracts the target object W whose position has been adjusted from the aligner AN, and transfers the target object W1 to one of the load-lock modules LL1 and LL2. Then, an internal pressure of the preliminary decompression chamber of one of the load-lock modules is decreased to a predetermined pressure. Thereafter, the transfer device TU2 of the transfer module TF extracts the target object W from one of the load-lock modules, and transfers the target object W to any one of the processing modules PM1 to PM6. Next, the target object W is processed in at least one of the processing modules PM1 to PM6. Then, the transfer device TU2 transfers the processed target object W from the processing module to one of the load-lock modules LL1 and LL2. Thereafter, the transfer device TU1 transfers the target object W from one of the load-lock modules to any one of the containers 4a to 4d.

The processing system 1 includes the controller MC as described above. The controller MC may be a computer including a processor, a storage device such as a memory, a display device, an input/output device, a communication device, and the like. The above-described series of operations of the processing system 1 are performed by causing the controller MC to control the respective components of the processing system 1 based on a program stored in the storage device.

Figure 3:
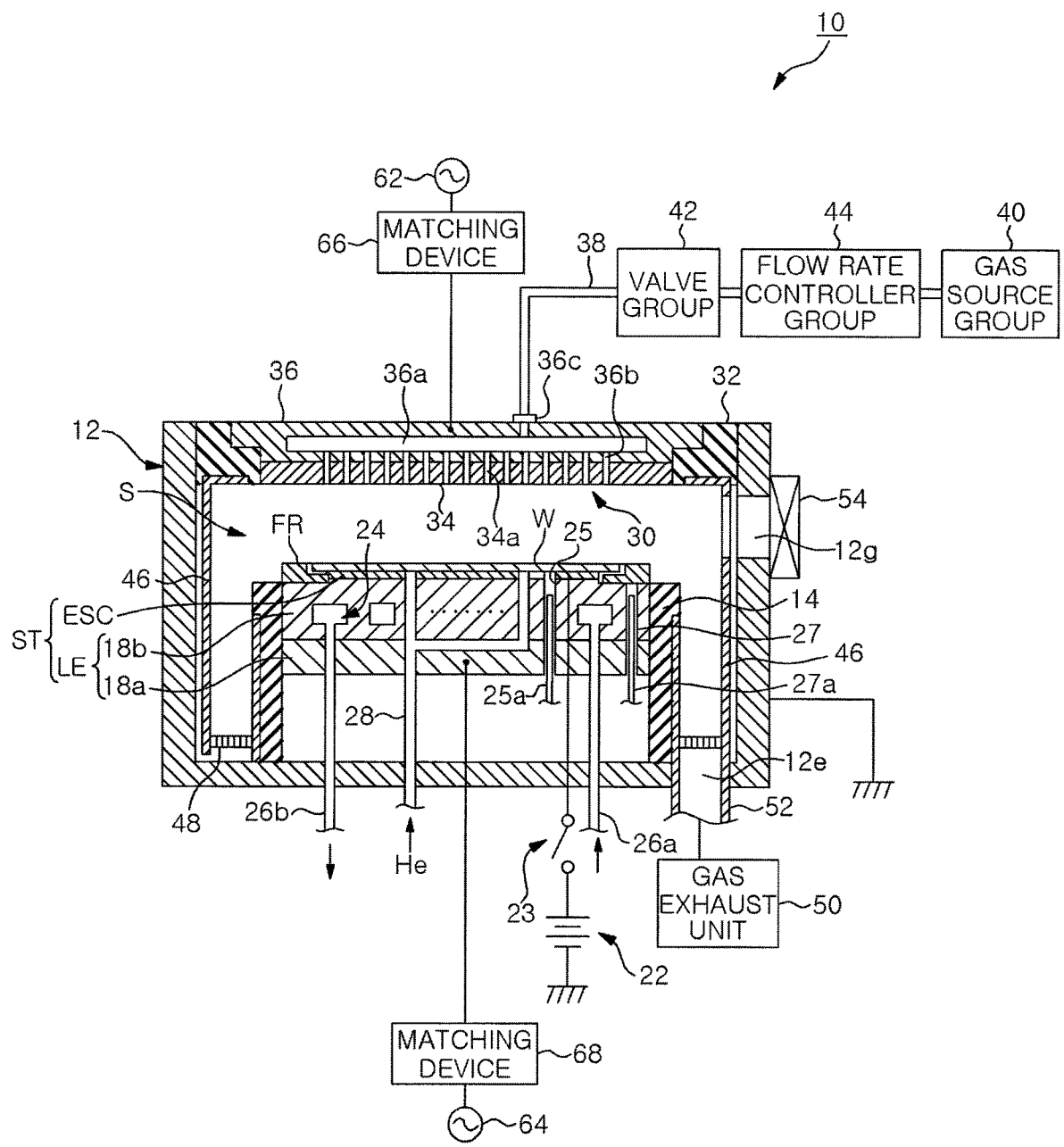
FIG. 3 shows an example of a plasma processing apparatus.

FIG. 3 shows an example of a plasma processing apparatus that can be employed as any one of the processing modules PM1 to PM6. The plasma processing apparatus 10 shown in FIG. 3 is a capacitively coupled plasma etching apparatus. The plasma processing apparatus 10 includes a substantially cylindrical chamber body 12. The chamber body 12 is made of, e.g., aluminum, and may have an anodically oxidized inner wall surface. The chamber body 12 is frame grounded.

A substantially cylindrical supporting member 14 is disposed on a bottom portion of the chamber body 12. The supporting member 14 is made of, e.g., an insulating material. The supporting member 14 is disposed in the chamber body 12 and extends upward from the bottom portion of the chamber body 12. A stage ST is disposed in the chamber S defined by the chamber body 12. The stage ST is supported by the supporting member 14.

The stage ST includes a lower electrode LE and an electrostatic chuck ESC. The lower electrode LE has a first plate 18a and a second plate 18b. The first plate 18a and the second plate 18b are made of a metal such as aluminum, and have a substantially disc shape. The second plate 18b is disposed on the first plate 18a and is electrically connected to the first plate 18a.

The electrostatic chuck ESC is disposed on the second plate 18b. The electrostatic chuck ESC has a structure in which an electrode made of a conductive film is embedded between two insulating layers or two insulating sheets, and has a substantially disc shape. A DC power supply 22 is electrically connected to the electrode of the electrostatic chuck ESC through a switch 23. The target object W is attracted and held on the electrostatic chuck ESC by an electrostatic attractive force such as a Coulomb force generated by a DC voltage from the DC power supply 22. Accordingly, the target object W can be held on the electrostatic chuck ESC can hold the target object W.

A focus ring FR is disposed on a peripheral portion of the second plate 18b. The focus ring FR is disposed to surround the edge of the target object W and the electrostatic chuck ESC. The focus ring FR has a first portion P1 and a second portion P2 (see FIG. 7). The first portion P1 and the second portion P2 have an annular plate shape. The second portion P2 is a portion outside the first portion P1. A thickness of the second portion P2 in a height direction is greater than that of the first portion P1. An inner edge P2i of the second portion P2 has a diameter greater than that of an inner edge P1i of the first portion P1. The target object W is mounted on the electrostatic chuck ESC such that the edge region of the target object is positioned above the first portion P1 of the focus ring FR. The focus ring FR may be made of a material selected among various materials such as silicon, silicon carbide, silicon oxide, and the like.

A coolant channel 24 is formed inside the second plate 18b. The coolant channel 24 constitutes a temperature control mechanism. A coolant is supplied to the coolant channel 24 from a chiller unit disposed outside the chamber body 12 through a line 26a. The coolant supplied to the coolant channel 24 is returned to the chiller unit through a line 26b. In this manner, the coolant is circulated between the coolant channel 24 and the chiller unit. By controlling the temperature of the coolant, the temperature of the target object W supported by the electrostatic chuck ESC is controlled.

A plurality of (e.g., three) through-holes 25 are formed through the stage ST. The through-holes 25 are formed at an inner side of the electrostatic chuck ESC in a plan view. Lift pins 25a are inserted into the through-holes 25, respectively.

FIG. 3 shows one through-hole 25 into which one lift pin 25a is inserted. The lift pin 25a is vertically movable through the through-hole 25. The target object W supported on the electrostatic chuck ESC is raised by the lift pins 25a.

A plurality (e.g., three) of through-holes 27 are formed through the stage ST (lower electrode LE) at an outer side of the electrostatic chuck ESC in a plan view. Lift pins 27a are inserted into the through-holes 27, respectively. FIG. 3 shows one through-hole 27 into which one lift pin 27a is inserted. The lift pin 27a is vertically movable through the through-hole 27. The focus ring FR supported on the second plate 18b is lifted as the lift pins 27a are lifted.

The plasma processing apparatus 10 is provided with a gas supply line 28. The gas supply line 28 supplies a heat transfer gas, e.g., He gas, from a heat transfer gas supply mechanism to a gap between the upper surface of the electrostatic chuck ESC and the backside of the target object W.

The plasma processing apparatus 10 further includes an upper electrode 30. The upper electrode 30 is disposed above the stage ST to face the stage ST. The upper electrode 30 is supported at an upper portion of the chamber body 12 through an insulating shielding member 32. The upper electrode 30 may include a ceiling plate 34 and a holder 36. The ceiling plate 34 faces the chamber S, and a plurality of gas injection holes 34a are formed in the ceiling plate 34. The ceiling plate 34 may be made of silicon or quartz. Alternatively, the ceiling plate 34 may be formed by coating a plasma-resistant film such as yttrium oxide on a surface of an aluminum base.

The holder 36 detachably holds the ceiling plate 34, and may be made of a conductive material such as aluminum. The holder 36 may have a water-cooling structure. A gas diffusion space 36a is disposed in the holder 36. A plurality of gas holes 36b respectively communicating with the gas injection holes 34a extend downward from the gas diffusion space 36a. A gas inlet port 36c for guiding a processing gas to the gas diffusion space 36a is formed at the holder 36. A gas supply line 38 is connected to the gas inlet port 36c.

A gas source group 40 is connected to the gas supply line 38 through a valve group 42 and a flow rate controller group 44. The gas source group 40 includes a plurality of gas sources for a plurality of gases. The valve group 42 includes a plurality of valves. The flow rate controller group 44 includes a plurality of flow rate controllers such as mass flow controllers. The gas sources of the gas source group 40 are connected to the gas supply line 38 through corresponding valves of the valve group 42 and corresponding flow rate controllers of the flow rate controller group 44.

In the plasma processing apparatus 10, a deposition shield 46 is detachably disposed along an inner wall of the chamber body 12. The deposition shield 46 is also provided at an outer periphery of the supporting member 14. The deposition shield 46 prevents etching by-products (deposits) from being attached to the chamber body 12. The deposition shield 46 may be formed by coating ceramic such as yttrium oxide or the like on an aluminum base.

At the bottom portion of the chamber body 12, a gas exhaust plate 48 is disposed between the supporting member 14 and the inner wall of the chamber body 12. The gas exhaust plate 48 may be formed by coating ceramic such as yttrium oxide or the like on an aluminum base, for example. A plurality of holes are formed through the gas exhaust plate 48 in a thickness direction thereof. A gas exhaust port 12e is disposed below the gas exhaust plate 48 in the chamber body 12. A gas exhaust unit 50 is connected to the gas exhaust port 12e through a gas exhaust line 52. The gas exhaust unit 50 has a vacuum pump such as a pressure control valve, a turbo molecular pump, or the like and is configured to reduce an internal pressure of the space in the chamber body 12 to a desired vacuum level. A loading/unloading port 12g for the target object W is formed at the sidewall of the chamber body 12. The loading/unloading port 12g can be opened and closed by a gate valve 54.

The plasma processing apparatus 10 further includes a first high-frequency power supply 62 and a second high-frequency power supply 64. The first high-frequency power supply 62 generates a first high-frequency for plasma generation having a frequency within a range of, e.g., 27 MHz to 100 MHz. The first high-frequency power supply 62 is connected to the upper electrode 30 through a matching device 66. The matching device 66 has a circuit for matching an output impedance of the first high-frequency power supply 62 and an input impedance of a load (the upper electrode 30) side. The first high-frequency power supply 62 may be connected to the lower electrode LE through the matching device 66.

The second high-frequency power supply 64 generates a second high-frequency power for attracting ions into the target object W. The second high-frequency power supply 64 generates the high-frequency power having a frequency within a range of, e.g., 400 kHz to 13.56 MHz. The second high-frequency power supply 64 is connected to the lower electrode LE through a matching device 68. The matching device 68 has a circuit for matching an output impedance of the second high-frequency power supply 64 and the input impedance of the load (the lower electrode LE) side.

In the plasma processing apparatus 10, gases from one or more gas sources selected from the plurality of gas sources are supplied to the chamber S. The internal pressure of the chamber S is set to a predetermined pressure by the gas exhaust unit 50. The gas in the chamber S is excited by the first high-frequency from the first high-frequency power supply 62, so that plasma is generated. Then, the target object W is processed by active species. If necessary, ions may be attracted to the target object W by the second high-frequency power for bias of the second high-frequency power supply 64.

Figure 4:
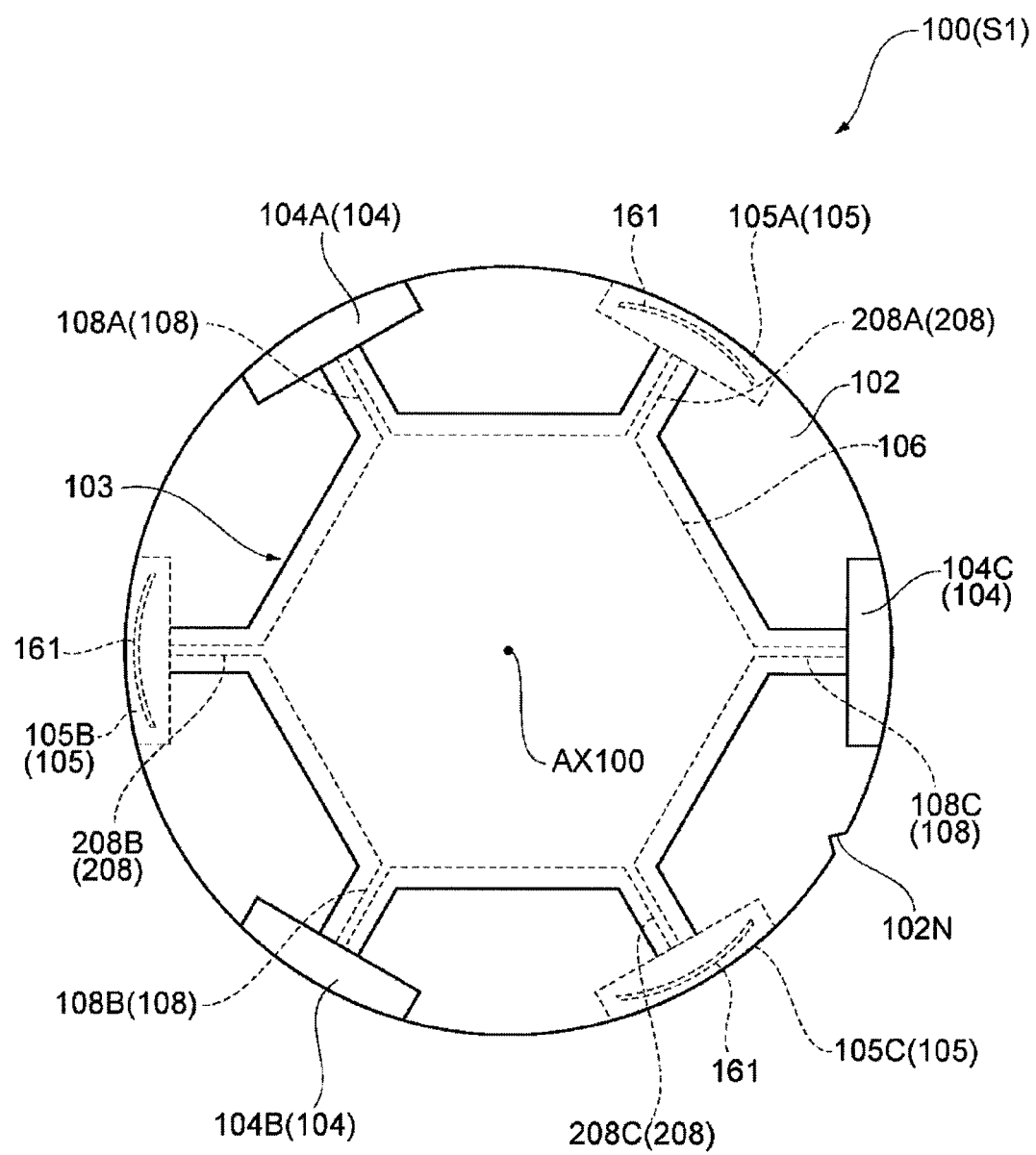
FIG. 4 is a plan view showing an example of a measuring device viewed from the top.
Figure 5:
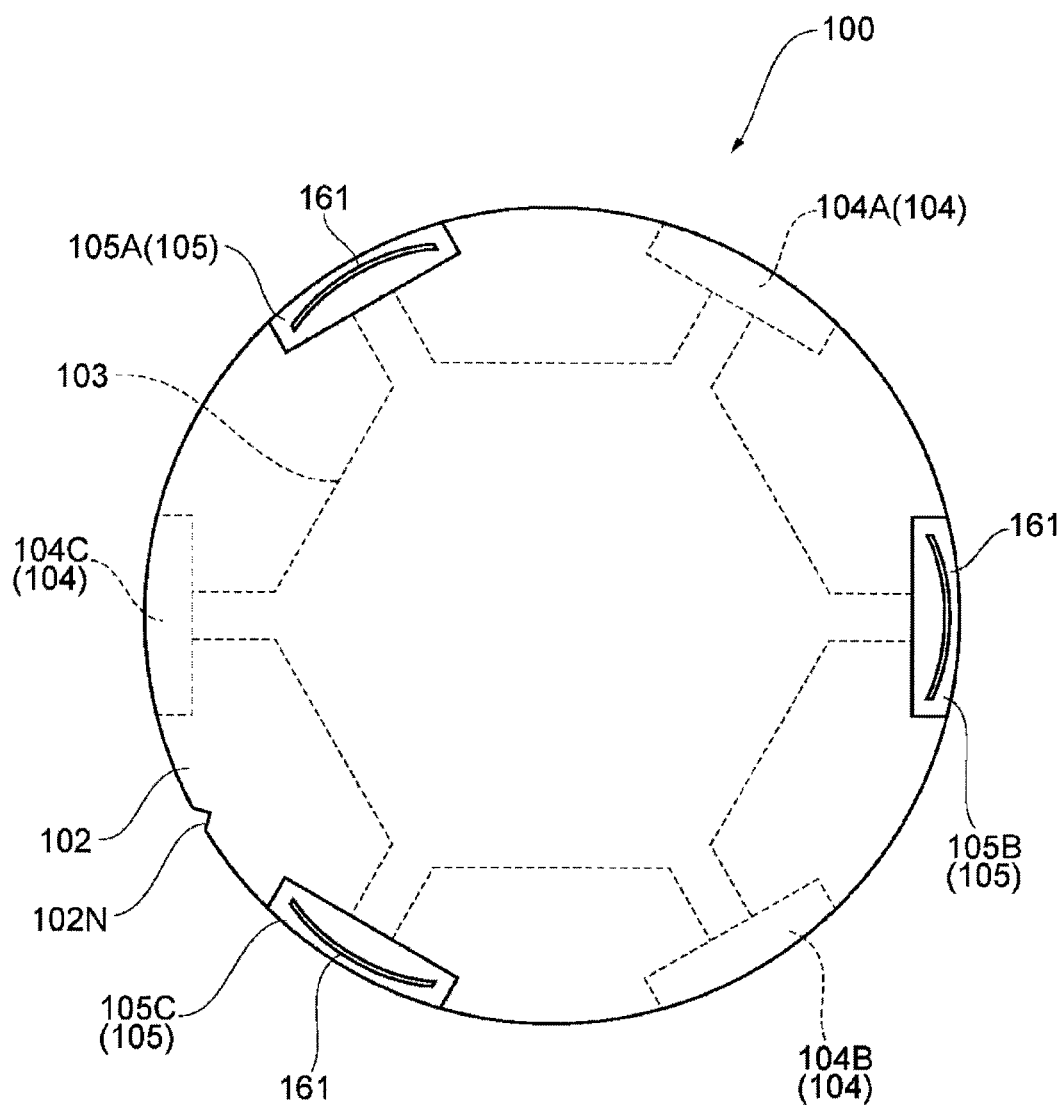
FIG. 5 is a plan view showing the example of the measuring device viewed from the bottom.

Hereinafter, the measuring device will be described. FIG. 4 is a plan view of the measuring device viewed from the top. FIG. 5 is a plan view of the measuring device viewed from the bottom. The measuring device 100 shown in FIGS. 4 and 5 includes a base substrate 102. The base substrate 102 is made of, e.g., silicon, and has a shape similar to that of the target object W, i.e., a substantially disc shape. A diameter of the base substrate 102 is the same as that of the target object W, e.g., 300 mm. The shape and the size of the measuring device 100 are determined by the shape and the size of the base substrate 102. Therefore, the measuring device 100 has the same shape as that of the target object W, and has the same size as that of the target object W. A notch 102N (or a marker) is formed at the edge of the base substrate 102.

The base substrate 102 is provided with a plurality of first sensors 104A to 104C for measuring an electrostatic capacitance. The first sensors 104A to 104C are arranged at equal intervals along the edge of the base substrate 102, e.g., along the entire circumference of the edge. Specifically, each of the first sensors 104A to 104C is disposed along the edge on the upper surface of the base substrate 102. The front end surfaces of the first sensors 104A to 104C extend along the side face of the base substrate 102.

The base substrate 102 is provided with a plurality of second sensors 105A to 105C for measuring an electrostatic capacitance. The second sensors 105A to 105C are arranged at equal intervals along the edge of the base substrate 102, e.g., along the entire circumference of the edge. Specifically, each of the second sensors 105A to 105C is disposed along the edge on the bottom surface of the base substrate. The sensor electrodes 161 of the second sensors 105A to 105C are disposed along the bottom surface of the base substrate 102. The second sensors 105A to 105C and the first sensors 104A to 104C are alternately arranged at intervals of 60° in the circumferential direction.

A circuit board 106 is disposed at the center of the upper surface of the base board 102. Wiring groups 108A to 108C for electrically connecting the circuit board 106 and the first sensors 104A to 104C are disposed between the circuit board 106 and the first sensors 104A to 104C. Further, wiring groups 208A to 208C for electrically connecting the circuit board 106 and the plurality of second sensors 105A to 105C are disposed between the circuit board 106 and the second sensors 105A to 105C. The circuit board 106, the wiring groups 108A to 108C, and the wiring groups 208A to 208C are covered by a cover 103.

Figure 6:
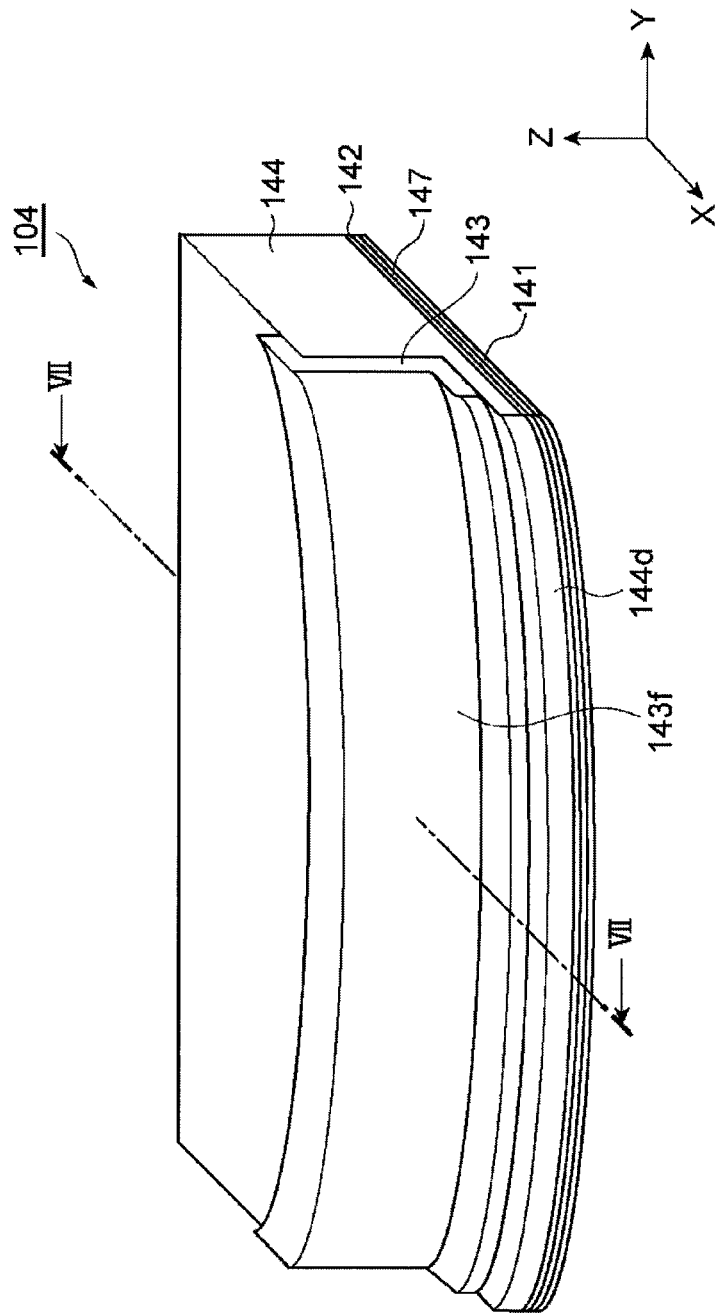
FIG. 6 is a perspective view showing an example of a first sensor.
Figure 7:
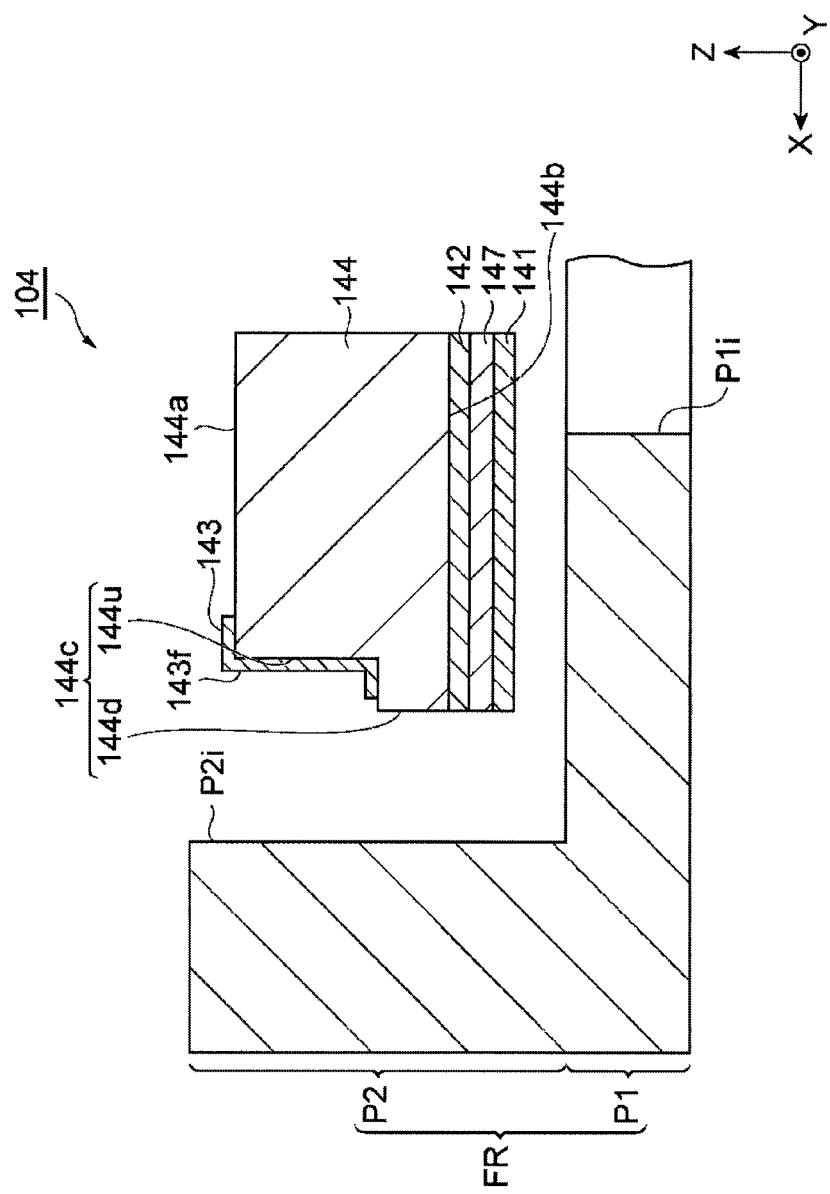
FIG. 7 is a cross-sectional view taken along a line VII-VII in FIG. 6.

Hereinafter, the first sensor will be described in detail. FIG. 6 is a perspective view showing an example of the first sensor. FIG. 7 is a cross-sectional view taken along a line VII-VII of FIG. 6. The first sensor 104 shown in FIGS. 6 and 7 is used as the first sensors 104A to 104C of the measuring device 100. In one example, the first sensor 104 is formed as a chip-shaped component. In the following description, an XYZ orthogonal coordinate system will be appropriately referred to. The X direction indicates a frontward direction of the first sensor 104. The Y direction that is orthogonal to the X direction indicates a width direction of the first sensor 104. The Z direction that is orthogonal to the X direction and the Y direction indicates an upward direction of the first sensor 104. FIG. 7 shows the focus ring FR in addition to the first sensor 104.

The first sensor 104 includes an electrode 141, a guard electrode 142, a sensor electrode 143, a substrate member 144, and an insulating region 147.

The substrate member 144 is made of, e.g., borosilicate glass or quartz. The substrate part 144 has an upper surface 144a, a bottom surface 144b, and a front end surface 144c. The guard electrode 142 is disposed below the bottom surface 144b of the substrate unit 144 and extends in the X direction and the Y direction. The electrode 141 is disposed below the guard electrode 142 through the insulating region 147 and extends in the X direction and the Y direction. The insulating region 147 is made of, e.g., $SiO_2$, SiN, $Al_2O_3$, or polyimide.

The front end surface 144c of the substrate member 144 is formed in a stepped shape. A lower portion 144d of the front end surface 144c protrudes toward the focus ring FR compared to an upper portion 144u of the front end surface 244c. The sensor electrode 143 extends along the upper portion 144u of the front end surface 144c. In one embodiment, the upper portion 144u and the lower portion 144d of the front end surface 144c may be curved surfaces having predetermined curvatures. In other words, the upper portion 144u of the front end surface 144c has a constant curvature at any position thereof, and the curvature of the upper portion 144u is a reciprocal of a distance between a central axis AX100 of the measuring device 100 and the upper portion 144u of the front end surface 144c. The lower portion 144d of the front end surface 144c has a constant curvature at any position thereof, and the curvature of the lower portion 144d is a reciprocal of a distance between the central axis AX100 of the measuring device 100 and the lower part 144d of the front end surface 144c.

The sensor electrode 143 is disposed along the upper portion 144u of the front end surface 144c. In one embodiment, a front surface 143f of the sensor electrode 143 is a curved surface. In other words, the front surface 143f of the sensor electrode 143 has a constant curvature at any position thereof, and the curvature of the front surface 143f is a reciprocal of a distance between the central axis AX100 of the measuring device 100 and the front surface 143f.

In the case of using the first sensor 104 as a sensor of the measuring device 100, the electrode 141 is connected to a wiring 181, the guard electrode 142 is connected to a wiring 182, and the sensor electrode 143 is connected to a wiring 183, which will be described later.

In the first sensor 104, the sensor electrode 143 is shielded from the bottom of the first sensor 104 by the electrode 141 and the guard electrode 142. Therefore, in accordance with the first sensor 104, the electrostatic capacitance can be measured with high directivity in a specific direction (X direction) in which the front surface 143f of the sensor electrode 143 is directed.

Figure 8:
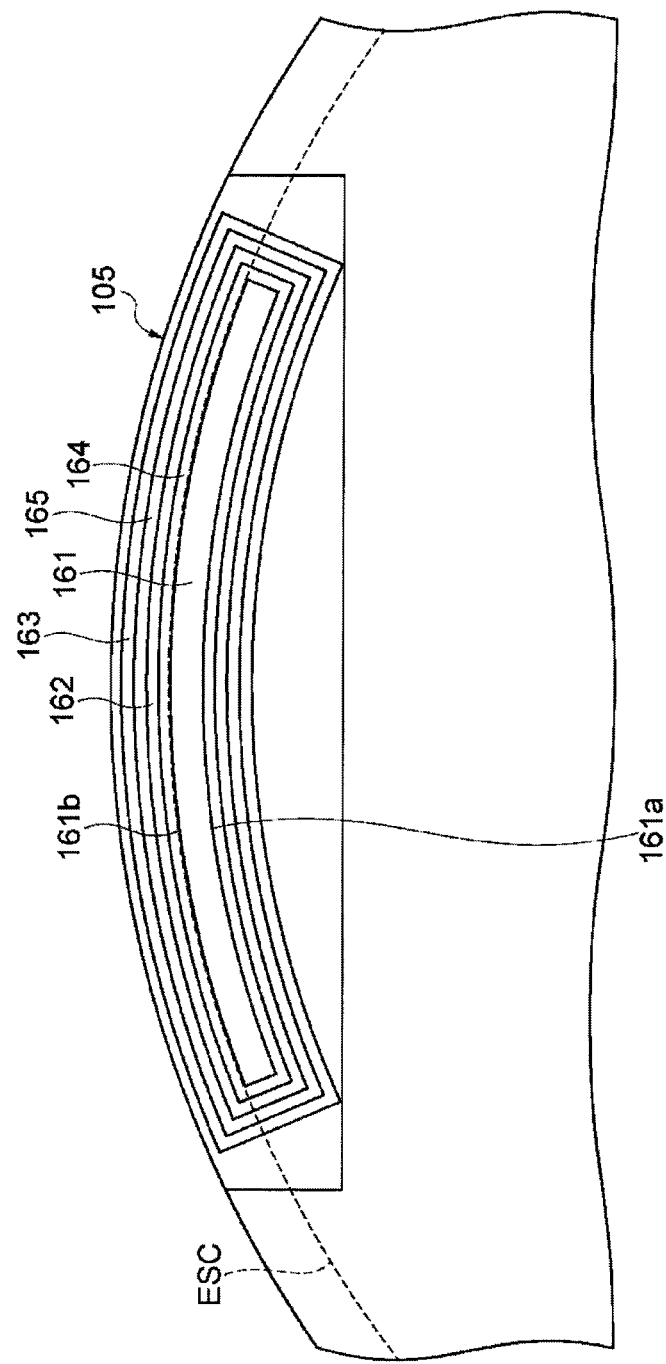
FIG. 8 is an enlarged view of the second sensor shown in FIG. 5.

Hereinafter, the second sensor will be described in detail. FIG. 8 is a partially enlarged view of FIG. 5 and shows one second sensor. The second sensor 105 includes a sensor electrode 161. A part of the edge of the sensor electrode 161 has an arc shape. In other words, the sensor electrode 161 has a planar shape defined by an inner edge 161a and an outer edge 161b that are two arcs having different radii about the central axis AX100. The outer edges 161b in the radial direction of the sensor electrodes 161 of the second sensors 105A to 105C extend on a common circle. The inner edges 161a in a radial direction of the sensor electrodes 161 of the second sensors 105A to 105C extend on another common circle. A curvature of a part of the edge of the sensor electrode 161 coincides with a curvature of the edge of the electrostatic chuck ESC. In one embodiment, the curvature of the outer edge 161b forming the radially outer edge of the sensor electrode 161 coincides with the curvature of the edge of the electrostatic chuck ESC. The center of the curvature of the outer edge 161b, i.e., the center of the circle on which the outer edge 161b extends, shares the central axis AX100.

In one embodiment, the second sensor 105 further includes a guard electrode 162 surrounding the sensor electrode 161. The guard electrode 162 has a frame shape and surrounds the sensor electrode 161 over the entire circumference thereof. The guard electrode 162 and the sensor electrode 161 are separated from each other with an insulating region 164 therebetween. Further, in one embodiment, the second sensor 105 further includes an electrode 163 surrounding the guard electrode 162 at the outer side of the guard electrode 162. The electrode 163 has a frame shape and surrounds the guard electrode 162 over the entire circumference thereof. The guard electrode 162 and the electrode 163 are separated from each other with an insulating region 165 therebetween.

Figure 9:
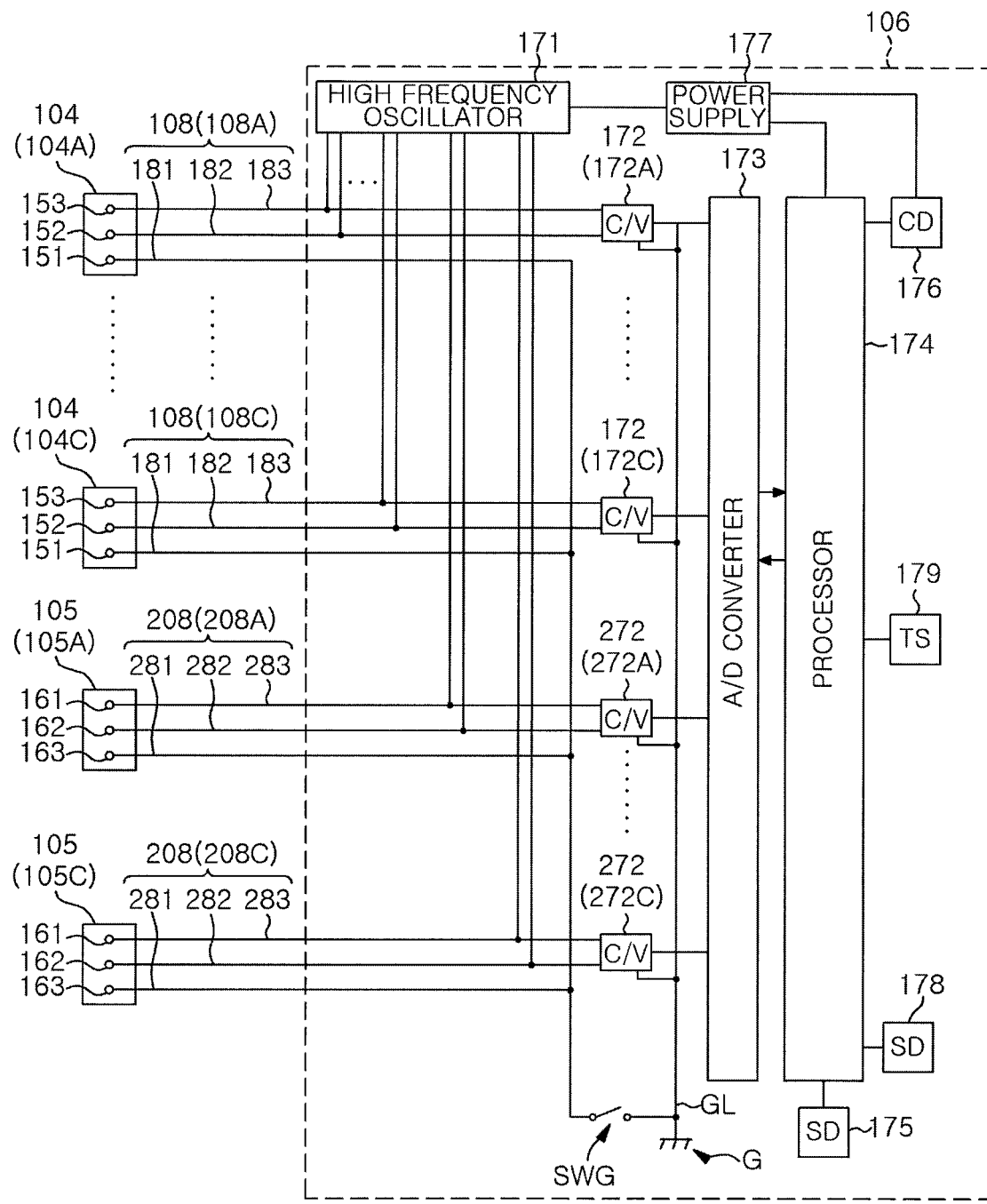
FIG. 9 shows a configuration of a circuit board of the measuring device.

Hereinafter, the configuration of the circuit board 106 will be described. FIG. 9 shows the configuration of the circuit board of the measuring device 10. The circuit board 106 includes a high frequency oscillator 171, a plurality of C/V conversion circuits 172A to 172C, a plurality of C/V conversion circuits 272A to 272C, an A/D converter 173, a processor 174, a storage device (SD) 175, a communication device (CD) 176, and a power supply 177. In one example, the processor 174, the storage device 175, and the like constitute a calculation unit. The circuit board 106 further includes a temperature sensor (TS) 179. The temperature sensor 179 outputs a signal corresponding to the detected temperature to the processor 174. For example, the temperature sensor 179 can obtain the ambient temperature of the measuring device 100.

Each of the first sensors 104A to 104C is connected to the circuit board 106 through a corresponding wiring group among the wiring groups 108A to 108C. Further, each of the first sensors 104A to 104C is connected to a corresponding C/V conversion circuit among the C/V conversion circuits 172A to 172C through some wirings included in the corresponding wiring group. Each of the second sensors 105A to 105C is connected to the circuit board 106 through a corresponding wiring group among the wiring groups 208A to 208C. Further, each of the second sensors 105A to 105C is connected to a corresponding C/V conversion circuit among the C/V conversion circuits 272A to 272C through some wirings included in the corresponding wiring group. Hereinafter, one first sensor 104 having the same configuration as that of each of the first sensors 104A to 104C, one wiring group 108 having the same configuration as that of each of the wiring groups 108A to 108C, and one C/V conversion circuit 172 having the same configuration as that of each of the C/V conversion circuits 172A to 172C will be described. Further, one second sensor 105 having the same configuration as that of each of the second sensors 105A to 105C, one wiring group 208 having the same configuration as that of each of the wiring groups 208A to 208C, and one C/V conversion circuit 272 having the same configuration as that of each of the C/V conversion circuits 272A to 272C will be described.

The wiring group 108 includes wirings 181 to 183. One end of the wiring 181 is connected to a pad 151 connected to the electrode 141. The wiring 181 is connected to a ground potential line GL connected to a ground G of the circuit board 106. The wiring 181 may be connected to the ground potential line GL through a switch SWG. One end of the wiring 182 is connected to a pad 152 connected to the guard electrode 142, and the other end of the wiring 182 is connected to the C/V conversion circuit 172. One end of the wiring 183 is connected to a pad 153 connected to the sensor electrode 143, and the other end of the wiring 183 is connected to the C/V conversion circuit 172.

The wiring group 208 includes wirings 281 to 283. One end of the wiring 281 is connected to the electrode 163. The wiring 281 is connected to a ground potential line GL connected to the ground GC of the circuit board 106. The wiring 281 may be connected to the ground potential line GL through the switch SWG. One end of the wiring 282 is connected to the guard electrode 162, and the other end of the wiring 282 is connected to the C/V conversion circuit 272. One end of the wiring 283 is connected to the sensor electrode 161, and the other end of the wiring 283 is connected to the C/V conversion circuit 272.

The high frequency oscillator 171 is connected to the power supply 177 such as a battery. The high frequency oscillator 171 is configured to receive power from the power supply 177 and generate a high frequency signal. The power supply 177 is also connected to the processor 174, the storage device 175, and the communication device 176. The high frequency oscillator 171 has a plurality of output lines. The high frequency oscillator 171 is configured to apply the generated high frequency signal to the wirings 182 and 183 through the output lines. Therefore, the high frequency oscillator 171 is electrically connected to the guard electrode 142 and the sensor electrode 143 of the first sensor 104, and the high frequency signal from the high frequency oscillator 171 is applied to the guard electrode 142 and the sensor electrode 143. Further, the high-frequency oscillator 171 is electrically connected to the sensor electrode 161 and the guard electrode 162 of the second sensor 105, and the high-frequency signal from the high-frequency oscillator 171 is supplied to the sensor electrode 161 and the guard electrode 162.

The wiring 182 connected to the pad 152 and the wiring 183 connected to the pad 153 are connected to the inputs of the C/V conversion circuit 172. In other words, the guard electrode 142 and the sensor electrode 143 of the first sensor 104 are connected to the inputs of the C/V conversion circuit 172. The sensor electrode 161 and the guard electrode 162 are connected to the inputs of the C/V conversion circuit 272. Each of the C/V conversion circuit 172 and the C/V conversion circuit 272 is configured to generate a voltage signal having an amplitude corresponding to the potential difference at the inputs thereof and to output the corresponding voltage signal. The C/V conversion circuit 172 generates a voltage signal corresponding to the electrostatic capacitance of the corresponding first sensor 104. In other words, as the electrostatic capacitance of the sensor electrode 143 connected to the C/V conversion circuit 172 is increased, the magnitude of the voltage signal outputted from the C/V conversion circuit 172 is increased. Similarly, as the electrostatic capacitance of the sensor electrode 161 connected to the C/V conversion circuit 272 is increased, the magnitude of the voltage of the voltage signal outputted from the C/V conversion circuit 272 is increased.

The outputs of the C/V conversion circuit 172 and the output of the C/V conversion circuit 272 are connected to the input of the A/D converter 173. The A/D converter 173 is connected to the processor 174. The A/D converter 173 is controlled by a control signal from the processor 174. The A/S converter 173 converts the output signal (voltage signal) of the C/V conversion circuit 172 and the output signal (voltage signal) of the C/V conversion circuit 272 into digital values, and outputs the digital values as detection values to the processor 174.

The storage device 175 is connected to the processor 174. The storage device 175 is, e.g., a volatile memory, and is configured to store measurement data. Another storage device (SD) 178 is connected to the processor 174. The storage device 178 is, e.g., a nonvolatile memory, and is configured to store a program that is read out and executed by the processor 174.

The communication device 176 conforms to any wireless communication standard. For example, the communication device 176 conforms to Bluetooth (registered trademark). The communication device 176 is configured to wirelessly transmit the measurement data stored in the storage device 175.

The processor 174 is configured to control the respective components of the measuring device 100 by executing the above-described program. For example, the processor 174 is configured to control the supply of the high frequency signal from the high frequency oscillator 171 to the guard electrode 142, the sensor electrode 143, the sensor electrode 161, and the guard electrode 162. Further, the processor 174 is configured to control the supply of power from the power supply 177 to the storage device 175, the supply of power from the power supply 177 to the communication device 176, and the like. Moreover, the processor 174 executes the above-described program to acquire the measurement value of the first sensor 104 and the measurement value of the second sensor 105 based on the detection value inputted from the A/D converter 173. In one embodiment, on the assumption that the detection value outputted from the A/D converter 173 is X, the processor 174 obtains the measurement value based on the detection value such that the measurement value is proportional to (a·X+b). Here, "a" and "b" are constants that are changed depending on the circuit state or the like. The processor 174 may have a predetermined calculation formula (function) in which the measurement value is proportional to (a·X+b).

In the above-described measuring device 100, the sensor electrodes 143 and the guard electrodes 142 face the inner periphery of the focus ring FR in a state where the measuring device 100 is disposed in a region surrounded by the focus ring FR. The measurement value generated based on the potential difference between the signal of the sensor electrode 143 and the signal of the guard electrode 142 indicates an electrostatic capacitance that reflects the distance between each of the sensor electrodes 143 and the focus ring. The electrostatic capacitance C is expressed by $C=\varepsilon S/d$. "$\varepsilon$" indicates a dielectric constant of a medium between the front surface 143$f$ of the sensor electrode 143 and the inner periphery of the focus ring FR; "S" indicates an area of the front surface 143$f$ of the sensor electrode 143; and "d" indicates a distance between the front surface 143$f$ of the sensor electrode 143 and the inner periphery of the focus ring FR.

Therefore, in accordance with the measuring device 100, the measurement data that reflects the relative positional relation between the focus ring FR and the measuring device 100 that imitates the target object W can be obtained. For example, a plurality of measurement values obtained by the measuring device 100 is decreased as the distance between the front surface 143$f$ of the sensor electrode 143 and the inner periphery of the focus ring FR is increased. Therefore, the misalignment amounts of the sensor electrodes 143 in a radial direction of the focus ring FR can be obtained based on the measurement values indicating the electrostatic capacitances of the sensor electrodes 143 of the first sensors 104A to 104C. Further, an error in the transfer position of the measuring device 100 can be obtained from the misalignment amounts of the sensor electrodes 143 of the first sensors 104A to 104C in the radial direction.

When the measuring device 100 is mounted on the electrostatic chuck ESC, the sensor electrodes 161 and the guard electrodes 162 face the electrostatic chuck ESC. As described above, the capacitance C is expressed by $C=\varepsilon S/d$. $\varepsilon$ indicates the dielectric constant of the medium between the sensor electrode 161 and the electrostatic chuck ESC; d indicates the distance between the sensor electrode 161 and the electrostatic chuck ESC; and S indicates an area where the sensor electrode 161 and the electrostatic chuck ESC are overlapped in a plan view. The area S changes depending on the relative positional relationship between the measuring device 100 and the electrostatic chuck ESC. Therefore, in accordance with the measuring device 100, the measurement data that reflects the relative positional relationship between the measuring device 100 that imitates the target object W and the electrostatic chuck ESC can be obtained.

In one example, when the measuring device 100 is transferred to a predetermined transfer position, i.e., a position on the electrostatic chuck ESC where the center of the electrostatic chuck ESC coincides with the center of the measuring device 100, the outer edge 161$b$ of the sensor electrode 161 may coincide with the edge of the electrostatic chuck ESC. In this case, if the sensor electrode 161 is misaligned radially outward with respect to the electrostatic chuck ESC due to the misalignment of the transfer position of the measuring device 100 from a predetermined transfer position, the area S is reduced. In other words, the electrostatic capacitance measured by the sensor electrode 161 becomes smaller than that measured when the measuring device 100 is transferred to a predetermined transfer position. Therefore, the misalignment amounts of the sensor electrodes 161 in the radial direction of the electrostatic chuck ESC can be obtained based on the measurement values indicating the electrostatic capacitances of the sensor electrodes 161 of the second sensors 105A to 105C. Further, an error in the transfer position of the measuring device 100 can be obtained from the misalignment amounts of the sensor electrodes 161 of the second sensors 105A to 105C in the radial direction.

Figure 10:
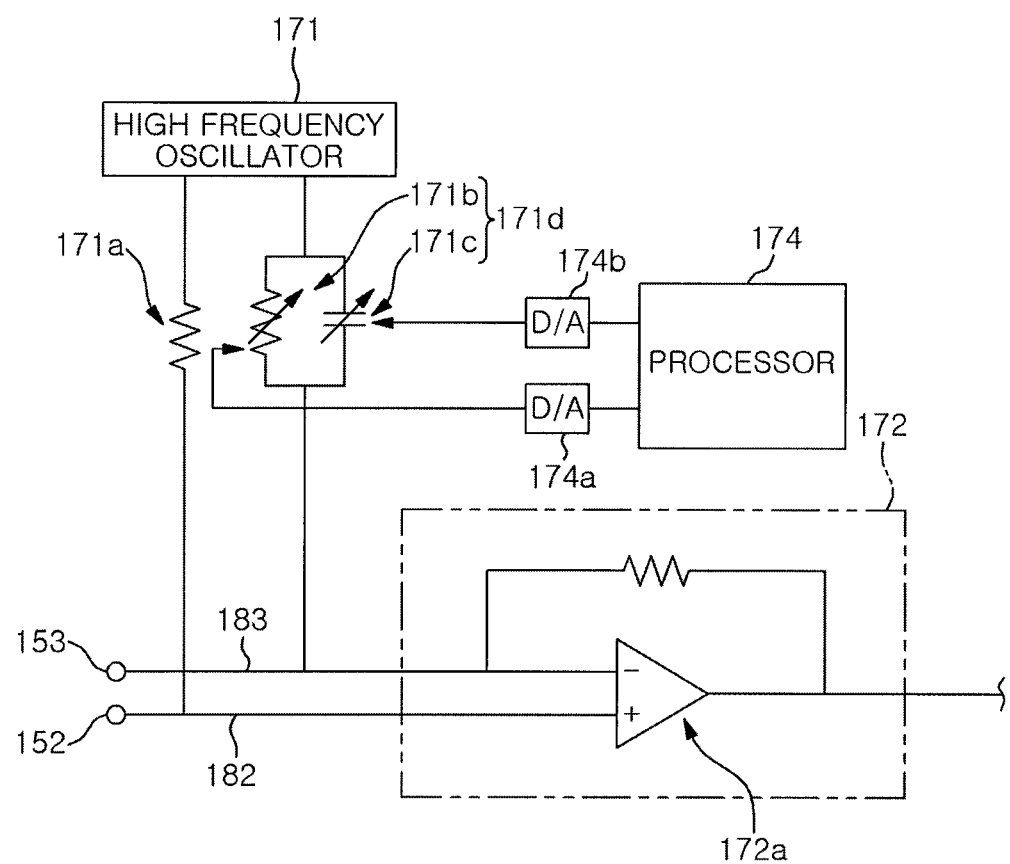
FIG. 10 shows a specific configuration of the circuit board of the measuring device.

Next, a configuration for suppressing changes in the measurement value of the electrostatic capacitance due to changes in the temperature environment will be described. First, the connection between the high-frequency oscillator 171 and the wiring 182 and the connection between the wiring 183 and the C/V conversion circuit 172 will be described in detail. FIG. 10 is a circuit diagram showing the connection between the high-frequency oscillator 171 and the wiring 182 and the connection between the wiring 183 and the C/V conversion circuit 172. As shown in FIG. 10, a resistor 171$a$ is connected between the high-frequency oscillator 171 and the wiring 182. A phase control circuit 171$d$ including a variable resistor 171$b$ and a variable capacitor 171$c$ is connected between the high-frequency oscillator 171 and the wiring 183. The C/V conversion circuit 172 includes an amplifier circuit 172$a$ having an operational amplifier and a resistor. In the amplifier circuit 172$a$, the wiring 183 is connected to an inverting input terminal of the operational amplifier, and the wiring 182 is connected to a non-inverting input terminal of the operational amplifier. The inverting input terminal and the output terminal of the operational amplifier are connected through a resistor. The amplifier circuit 172$a$ amplifies a potential difference between a signal from the sensor electrode 143 and a signal from the guard electrode 142, that are inputted to the C/V conversion circuit 172.

Similarly to the connection between the high-frequency oscillator 171 and the wiring 182 and the connection between the wiring 183 and the C/V conversion circuit 172, the high-frequency oscillator 171 and the wiring 282 are connected, and the wiring 283 and the C/V conversion circuit 272 are connected. In other words, a resistor is connected between the high-frequency oscillator 171 and the wiring 282. A phase control circuit including a variable resistor and a variable capacitor is connected between the high-frequency oscillator 171 and the wiring 283. The C/V conversion circuit 272 includes an amplification circuit having an operational amplifier and a resistor. In the amplifier circuit, the wiring 283 is connected to an inverting input terminal of the operational amplifier, and the wiring 282 is connected to a non-inverting input terminal of the operational amplifier. The inverting input terminal and the output terminal of the operational amplifier are connected through a resistor.

In the above-described circuit configuration, the amplitude of the signal from the sensor electrode 143 can be changed by changing a resistance value of the variable resistor 171$b$ of the phase control circuit 171$d$. Further, the phase of the signal from the sensor electrode 143 can be changed by changing the electrostatic capacitance value of the variable capacitor 171$c$ of the phase control circuit 171$d$. In one embodiment, the admittance of the phase control circuit 171$d$ is adjusted by causing the processor 174 to adjust/control the resistance value of the variable resistor 171$b$ and the electrostatic capacitance value of the variable capacitor 171$c$.

In FIG. 10, the output of the D/A converter 174a connected to the processor 174 is inputted to the variable resistor 171b. The processor 174 outputs, as a digital signal, a parameter for adjusting the resistance value of the variable resistor 171b to the D/A converter 174a. The D/A converter 174a converts the inputted digital signal into an analog signal and outputs the analog signal to the variable resistor 171b. Accordingly, the resistance value of the variable resistor 171b is controlled to a resistance value corresponding to the digital signal outputted from the processor 174.

The output of the D/A converter 174b connected to the processor 174 is inputted to the variable capacitor 171c. The processor 174 outputs, as a digital signal, a parameter for adjusting the electrostatic capacitance value of the variable capacitor 171c to the D/A converter 174b. The D/A converter 174b converts the inputted digital signal into an analog signal and outputs the analog signal to the variable capacitor 171c. Accordingly, the electrostatic capacitance value of the variable capacitor 171c is controlled to an electrostatic capacitance value corresponding to the digital signal outputted from the processor 174.

The parameter for adjusting the resistance value of the variable resistor 171b and the parameter for adjusting the electrostatic capacitance value of the variable capacitor 171c may be stored as a table in the storage device 178, for example. The table has, as parameters, values corresponding to a plurality of temperatures. The parameters are used for adjusting reference points of the voltage signals outputted from the C/V conversion circuits 172 and 272 at the respective temperatures. In one example, the reference point adjustment may be zero point adjustment. In other words, the parameters may be values for adjusting the resistance value of the variable resistor 171b and the electrostatic capacitance value of the variable capacitor 171c such that the voltage signals outputted from the C/V conversion circuits 172 and 272 become zero in a state where there is no target object to be detected by the measuring device 100. In the zero point adjustment, it is relatively easy to set the measuring device 100 at the time of performing the reference point adjustment.

In one example, the storage device 178 has a table for controlling the variable resistor 171b for each of the first sensors 104A to 104C. The storage device 178 has a table for controlling the variable resistor 171b for each of the second sensors 105A to 105C. Each table has parameters for controlling the variable resistors 171b corresponding to the respective sensors at a plurality of temperatures. The storage device 178 has a table for controlling the variable capacitor 171c for each of the first sensors 104A to 104C. The storage device 178 has a table for controlling the variable capacitor 171c for each of the second sensors 105A to 105C. Each table has parameters for controlling the variable capacitors 171c corresponding to the respective sensors at a plurality of temperatures.

An example of a method for obtaining such a table will be described. The measuring device 100 may be used in, e.g., a dehumidified vacuum environment having a temperature of 10° C. to 80° C. and an ultimate vacuum level of about 10 mTorr.

The parameters are obtained under an environment in which the measuring device 100 is actually used. In other words, in one example, the parameters may be obtained under a dehumidified vacuum environment having a temperature of 10° C. to 80° C. and an ultimate vacuum level of about 10 mTorr. When the parameters are obtained, the variable resistor 171b and the variable capacitor 171c are adjusted such that the voltage signals outputted from the C/V conversion circuits 172 and 272 become zero in a state where there is no target object to be detected by the measuring device 100 in the above-described environment. The state where there is no target object to be detected by the measuring device 100 may be, e.g., a state where a space in which the detection value becomes zero is formed between the measuring device 100 and the detection target object. Then, the resistance value of the adjusted variable resistor 171b and the electrostatic capacitance value of the adjusted variable capacitor 171c are obtained as target parameters. The parameters may be values of digital signals outputted from the processor 174. In a state where the measuring device 100 is adjusted to a temperature of 10° C. to 80° C., the parameters are obtained at the respective temperatures, thereby creating a table. The parameters may be obtained at every 10° C. from 10° C. to 80° C. For example, the variable resistor 171b and the variable capacitor 171c may be actually adjusted only at 10° C., 20° C., 30° C., 40° C., 50° C., 60° C., 70° C., and 80° C. In this case, parameters in a temperature range where no parameter is obtained may be estimated based on the obtained parameters. In one example, the parameters in the temperature range where no parameter is obtained may be determined by performing linear interpolation between the obtained parameters.

As described above, on the assumption that the detection value outputted from the A/D converter 173 is X, the processor 174 obtains the measurement value that is proportional to (a·X+b). Here, "a" and "b" are constants that are changed depending on the circuit state or the like and may depend on the environmental temperature. In one embodiment, the constants "a" and "b" are adjusted to correspond to the C/V conversion circuits 172A to 172C and the C/V conversion circuits 272A to 272C such that the detection value X outputted from the A/D converter 173 is converted into a measurement value indicating the calculated electrostatic capacitance. The calculated electrostatic capacitance can be obtained by the above-described equation for calculating the electrostatic capacitance C.

In one embodiment, the constants "a" and "b" are adjusted by the processor 174. The constants "a" and "b" may be stored as a table in the storage device 178, for example. The table has, as elements, the constants "a" and "b" associated with the respective temperatures. In one example, the storage device 178 has tables corresponding to the C/V conversion circuits 172A to 172C and the C/V conversion circuits 272A to 272C. In other words, the storage device 178 stores a plurality of constant groups respectively associated with a plurality of temperatures in order to suppress the temperature dependence of the measurement values outputted from the A/D converter 173. Each constant group has a plurality of constants "a" and "b" respectively corresponding to the C/V conversion circuits 172A to 172C and the C/V conversion circuits 272A to 272C. The processor 174 selects a constant group corresponding to the environmental temperature, and uses a plurality of constants "a" and "b" of the selected constant group as constants of a corresponding function.

An example of a method for obtaining such a table will be described. The measuring device 100 may be used in, e.g., a dehumidified vacuum environment having a temperature of 10° C. to 80° C. and an ultimate vacuum level of about 10 mTorr.

The constants "a" and "b" are obtained in an environment when the measuring device 100 is actually used. In other words, the constants "a" and "b" are obtained in, e.g., a dehumidified vacuum environment having a temperature of 10° C. to 80° C. and an ultimate vacuum level of about 10 mTorr. In order to obtain the constants "a" and "b", first, the measuring device 100 is disposed at an inner side of the focus ring FR and on the electrostatic chuck ESC. In this state, the relative position of the measuring device 100 and the detection value X at that position are obtained while changing the position of the measuring device 100 in a horizontal direction. The relative position of the measuring device 100 may be a distance from each of the first sensors 104A to 104C to the focus ring FR. In this case, the electrostatic capacitances of the first sensors 104A to 104C can be calculated. Further, the relative position of the measuring device 100 may be a position of each of the second sensors 105A to 105C with respect to the electrostatic chuck ESC. In this case, an area where the sensor electrode 161 and the electrostatic chuck ESC are overlapped with each other in a plan view can be calculated. In other words, the electrostatic capacitances of the second sensors 105A to 105C can be calculated. Then, the constants "a" and "b" are calculated such that the obtained detection value X approximates the calculated electrostatic capacitance. The calculated constants "a" and "b" are obtained as elements constituting the table. In a state where the measuring device 100 is adjusted to a temperature within a range of 10° C. to 80° C., the constants "a" and "b" are obtained at the respective temperatures, thereby creating the table.

Figure 11:
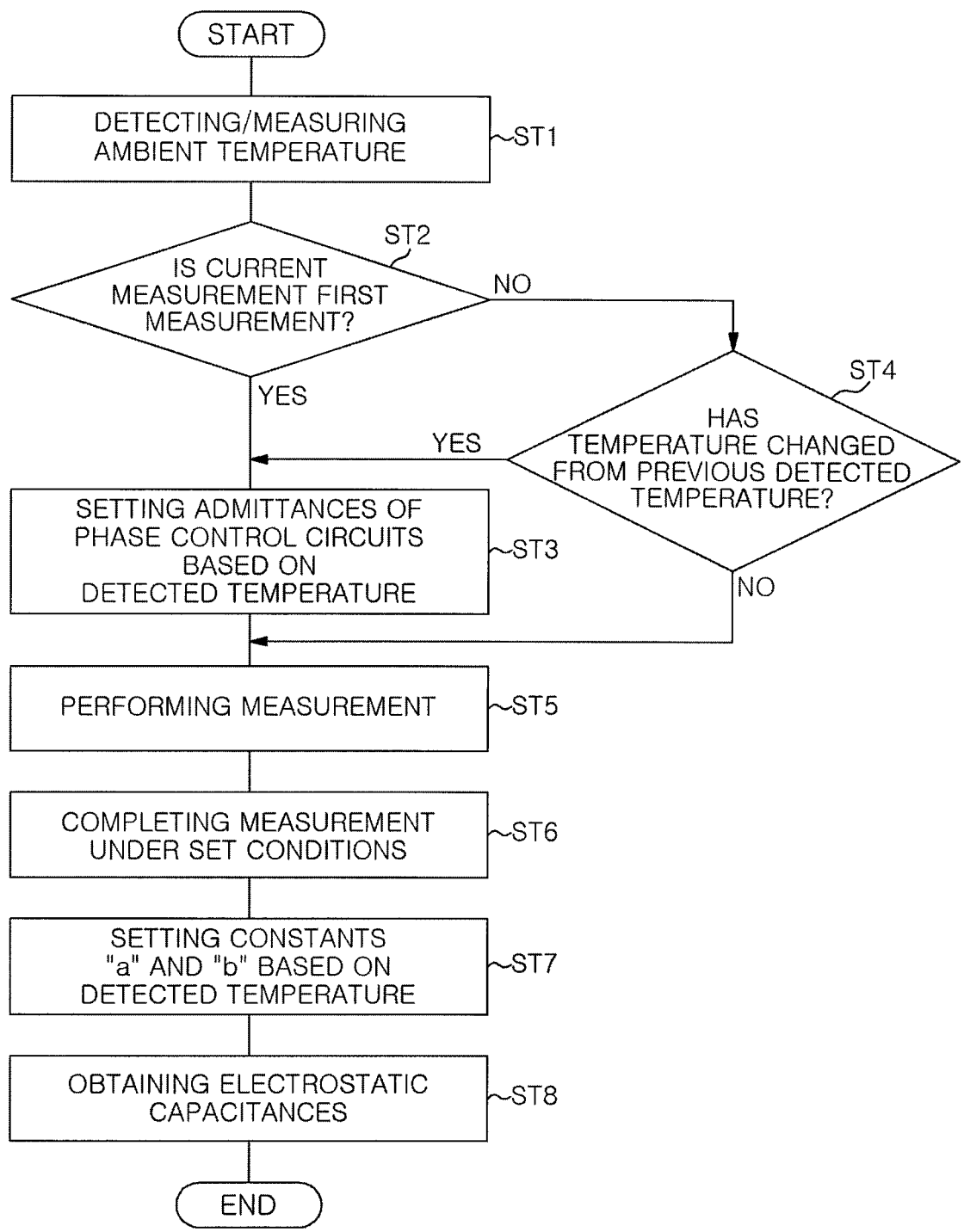
FIG. 11 is a flowchart showing an example of a method of operating the measuring device.

Next, the operation of the measuring device 100 will be described. FIG. 11 is a flowchart showing the operation of measuring the electrostatic capacitance using the measuring device 100. The operations in the flowchart are controlled by the processor 174 of the measuring device 100. In one embodiment, the measuring device 100 is transferred in advance by the transfer device TU2 to a position on the mounting area specified by the transfer position data. Specifically, the transfer device TU1 transfers the measuring device 100 to one of the load-lock modules LL1 and LL2. Then, the transfer device TU2 transfers the measuring device 100 from one of the load-lock modules to any one of the processing modules PM1 to PM6 based on the transfer position data, and mounts the measuring device 100 on the electrostatic chuck ESC. The transfer position data is coordinate data that is predetermined such that the position of the central axis AX100 of the measuring device 100 coincides with the central position of the focus ring FR. The inside of the processing module to which the measuring device 100 is transferred may be adjusted to a dehumidified vacuum environment having an ultimate vacuum level of about 10 mTorr. An operator may preset conditions such as the number of times of measurement of the electrostatic capacitance, and the like.

In order to measure the electrostatic capacitance, first, the ambient temperature is detected by the temperature sensor 179 (step ST1). The detected temperature data is stored in, e.g., the storage device 175. Next, it is determined whether or not the current measurement is a first measurement (step ST2). If it is determined that the current measurement is the first measurement, the resistance value of the variable resistor 171b and the electrostatic capacitance value of the variable capacitor 171c in the phase control circuit 171d are set based on the temperature data detected in step ST1 (step ST3). In other words, the processor 174 obtains the temperature data detected by the temperature sensor 179 from the storage device 175. Then, the processor 174 obtains parameters corresponding to the temperature data from a plurality of parameters for adjusting the resistance value of the variable resistor 171b and the electrostatic capacitance value of the variable capacitor 171c stored in the storage device 178. The processor 174 outputs, as a digital signal, the acquired parameters to the D/A converter 174a, so that the resistance value of the variable resistor 171b and the electrostatic capacitance value of the variable capacitor 171c are controlled.

If it is determined in step ST2 that the current measurement is not the first measurement, the temperature detected in the previous measurement is compared with the temperature detected in the current measurement. In other words, it is determined whether the temperature condition has changed from the temperature detected in the previous measurement (step ST4). For example, the processor 174 calculates the absolute value of the difference between the previous temperature data acquired from the storage device 175 and the current temperature data. Then, the processor 174 compares the absolute value of the difference with a reference value. The reference value is a temperature that is likely to affect the measurement result, and may be, e.g., 1° C. When it is determined that the absolute value of the difference is greater than or equal to the reference value, the resistance value of the variable resistor 171b and the electrostatic capacitance value of the variable capacitor 171c in the phase control circuit 171d are set again based on the currently measured temperature data (step ST3). On the contrary, when it is determined that the absolute value of the difference is smaller than the reference value, the previously set resistance value of the variable resistor 171b and the previously set electrostatic capacitance value of the variable capacitor 171c in the phase control circuit 171d are used.

Next, the measuring device 100 performs measurement (step ST5). In step ST5, an output signal (voltage signal) of the C/V conversion circuit 172 and an output signal (voltage signal) of the C/V conversion circuit 272 are converted into digital values by the A/D converter, and the A/D converter outputs the output signals as detection values to the processor 174. The detection values may be associated with the temperature data and stored in, e.g., the storage device 175.

Next, it is determined whether the measurement has been completed under the set conditions (step ST6). For example, when the number of times of measurements of the electrostatic capacitance is preset as a condition, it is determined whether the measurement has been performed the preset number of times. If the measurement has not been completed, the processing returns to step ST1 and the measurement is repeated. If the measurement has been completed, the processing proceeds to step ST7.

In step ST7, constants for a function for calculating a measurement value indicating the electrostatic capacitance from the detection value X outputted from the A/D converter 173 is set. In one embodiment, the function is set such that the measurement value is proportional to $(a \cdot X + b)$. The processor 174 obtains constants "a" and "b" corresponding to the temperature data associated with the detection value from the table including a plurality of constants "a" and "b" stored in the storage device 178. In this manner, the constants "a" and "b" are set.

Next, the electrostatic capacitance is obtained (step ST8). In other words, the detection value is converted into a measurement value indicating the electrostatic capacitance by the function that reflects the obtained constants "a" and "b". The data of the electrostatic capacitance (measurement value) obtained by the sensors may be stored in the storage device 175 while being associated with temperature data, the detection value (digital value), and the like. In one embodiment, the misalignment amount of the center of the measuring device 100 with respect to the central position of the focus ring FR can be calculated based on the electrostatic capacitances obtained by the first sensors 104A to 104C.

Further, the misalignment amount of the center of the measuring device 100 with respect to the central position of the electrostatic chuck ESC can be calculated based on the electrostatic capacitances obtained by the second sensors 105A to 105C. The misalignment amount can be used for, e.g., calibrating the transfer position data used for the transfer operation of the transfer device TU2.

In the case of performing the plasma processing in the semiconductor manufacturing apparatus, the positional relationships among the target object W, the electrostatic chuck ESC, and the focus ring FR are important. Therefore, it is required to obtain highly reliable data indicating the transfer position of the target object W. In one example, the data indicating the positional relationships among the transferred measuring device 100, the electrostatic chuck ESC, and the focus ring FR can be obtained by transferring the measuring device 100 having the same shape as that of the target object W.

In the measuring device 100, the plurality of phase control circuits 171*d* are connected between the plurality of sensor electrodes and the high-frequency oscillator 171. Therefore, the magnitudes of the voltage signals outputted from the C/V conversion circuits 172 can be adjusted by adjusting the admittances of the phase control circuits 171*d*. However, the magnitudes of the voltage signals outputted from the C/V conversion circuits 172 may be changed by the influence of the ambient temperature. For example, even if the zero point adjustment was performed at a certain temperature, if the temperature is changed, the voltage signal outputted from the C/V conversion circuit 172 may be increased.

In the measuring device 100, the admittances of the phase control circuits 171*d* corresponding to the C/V conversion circuits are adjusted using the parameter corresponding to the temperature detected by the temperature sensor 179. Therefore, it is possible to control the changes in the magnitudes of the voltage signals due to the temperature changes. The processor 174 can control the variation in the voltage signals due to the difference between the sensor electrodes while referring to the parameters corresponding to the phase control circuits 171*d*.

The processor 174 refers to the function for calculating the electrostatic capacitance (measurement value) from the detection value X (digital value). Further, the processor 174 refers to the constants corresponding to the temperature of the measuring device 100 as the constants for the function. In other words, the processor 174 calculates a plurality of electrostatic capacitances based on a plurality of functions using the constants corresponding to the temperature detected by the temperature sensor 179. The constants of the function may be changed depending on the temperature of the circuit of the measuring device 100. In one embodiment, the processor 174 uses the constants corresponding to the temperature detected by the temperature sensor 179, so that the changes in the magnitude of the electrostatic capacitance due to the temperature changes can be controlled.

The first sensors 104 are disposed on the edge of the base substrate 102. The first sensors 104 face the focus ring FR surrounding the base substrate 102. With this configuration, the relative position between the focus ring FR and the measuring device 100 can be obtained.

The second sensors 105 are disposed on the bottom surface of the base substrate 102. The second sensors 105 face the electrostatic chuck ESC on which the base substrate 102 is mounted. With this configuration, the relative position between the electrostatic chuck ESC and the measuring device 100 can be obtained.

Figure 12:
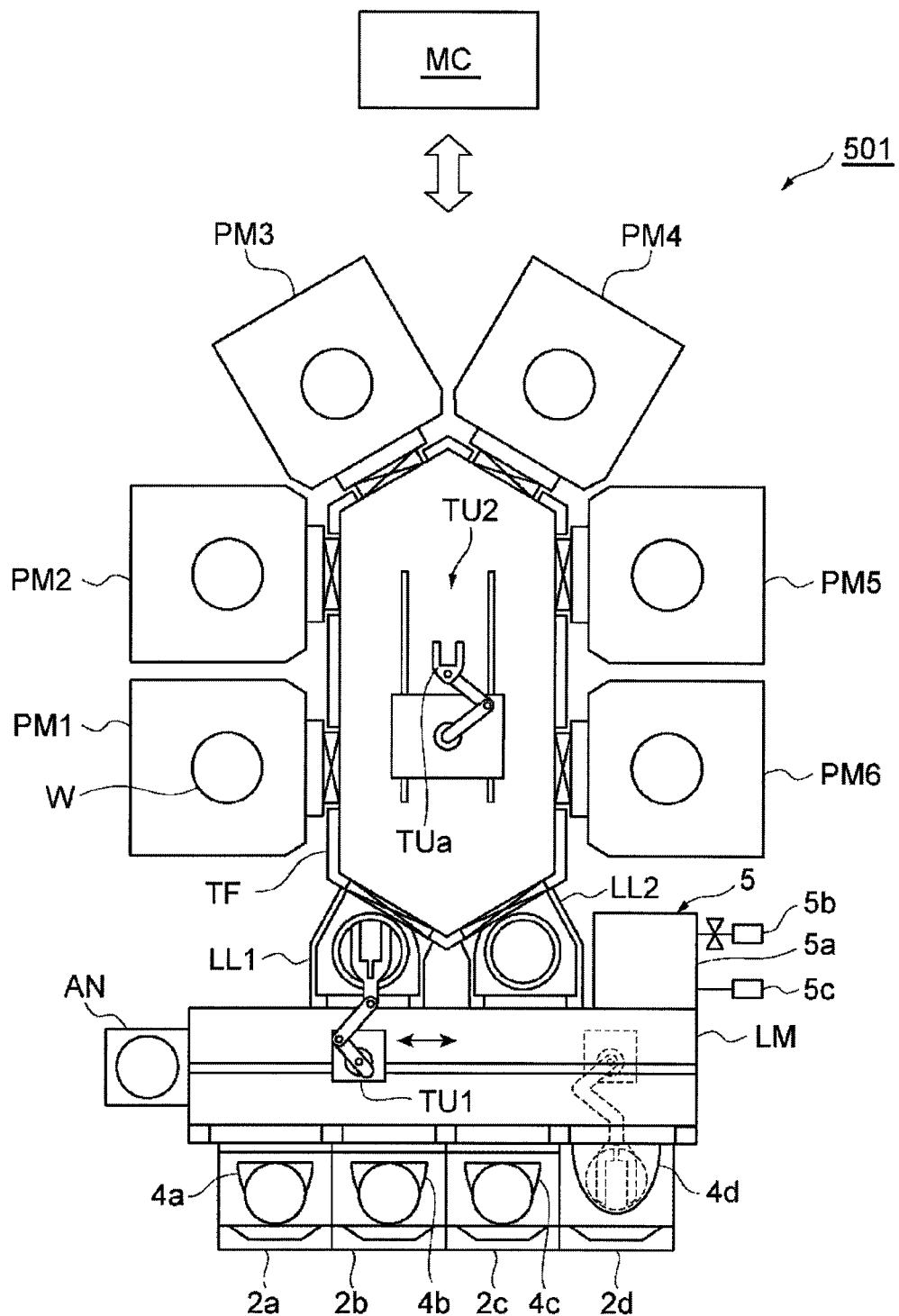
FIG. 12 shows another processing system.

Hereinafter, another embodiment will be described. FIG. 12 shows a processing system 501. The processing system 501 includes the tables 2*a* to 2*d*, the containers 4*a* to 4*d*, the loader module LM, the aligner AN, the load-lock modules LL1 and LL2, the processing modules PM1 to PM6, the transfer module TF, the controller MC, and the storage device 5.

The storage device 5 can store the measuring device 100 under a dehumidified environment. As shown in FIG. 12, the storage device 5 includes a chamber 5*a* having a sealable inner space, a gas supply unit 5*b* connected to the chamber 5*a* through a valve, and a gas exhaust unit 5*c* connected to the chamber 5*a*. The storage device 5 may be disposed near the loader module LM. In this case, the chamber 5*a* may be connected to the transfer space of the loader module LM through a gate through which the measuring device 100 can penetrate. When the gate is opened, the space in the chamber 5*a* and the transfer space in the loader module LM are connected to each other. When the gate is closed, the space in the chamber 5*a* can be sealed. The measuring device 100 can be transferred by the transfer device TU1 in a state where the gate of the chamber 5*a* is opened. For example, the transfer device TU1 can transfer the measuring device 100 between the load-lock modules LL1 to LL2 and the chamber 5*a* through the loader module LM.

The gas supply unit 5*b* can supply a purge gas containing no moisture into the chamber 5*a*. The purge gas may be, e.g., an inert gas such as a nitrogen gas or the like. The gas exhaust unit 5*c* is configured to exhaust the gas in the chamber 5*a* to the outside. In one example, the gas exhaust unit 5*c* may be a vacuum pump that can reduce the internal pressure of the chamber 5*a* to a desired vacuum level.

For example, the internal space of the chamber 5*a* can be set to a dehumidified environment by supplying the purge gas from the gas supply unit 5*b* into the chamber 5*a*. In addition, the internal space of the chamber 5*a* can be set to a dehumidified environment by causing the gas exhaust unit 5*c* to evacuate the internal space of the chamber 5*a*. In one example, the internal space of the chamber 5*a* may be adjusted to a dehumidified vacuum environment having an ultimate vacuum degree of about 10 mTorr. The dehumidified environment indicates an environment in which a humidity (relative humidity) in a space is 20% or less. The dehumidified environment can be obtained by providing a dehumidifying agent such as silica gel or the like in the chamber 5*a*.

Figure 13:
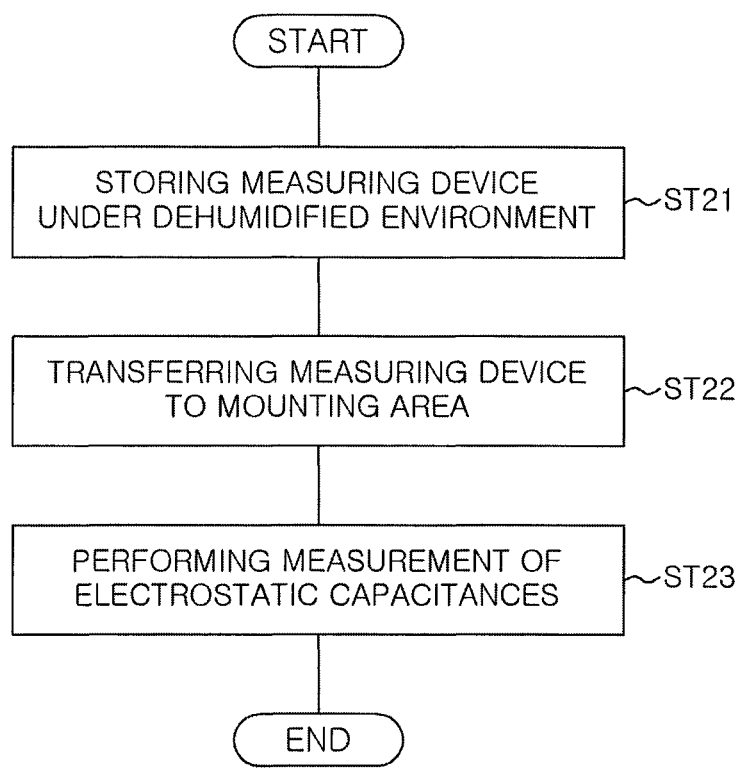
FIG. 13 is a flowchart showing an example of a sequence of measuring electrostatic capacitances using the measuring device.

FIG. 13 is a flowchart showing a sequence of measuring an electrostatic capacitance using the measuring device 100 in the processing system 501 shown in FIG. 12. In the example of FIG. 13, the measuring device 100 is stored in a dehumidified environment before it is transferred to a position on the mounting area (step ST21). In one example, the inside of the chamber 5*a* is set to a dehumidified environment in a state where the measuring device 100 is disposed in the chamber 5*a* of the storage device 5. At this time, the inside of the chamber 5*a* may be set to a dehumidified environment such as a dehumidified purge gas atmosphere, a vacuum environment or the like.

Next, the measuring device 100 is transferred by the transfer device TU2 to the position on the mounting area specified by the transfer position data (step ST22). In one example, the measuring device 100 may be stored in a dehumidified environment generated by the storage device 5 until shortly before the transfer. In step ST22, the transfer device TU1 transfers the measuring device 100 from the storage device 5 to one of the load-lock modules LL1 and LL2. Then, the transfer device TU2 transfers the measuring device 100 from one of the load-lock modules to any one of the processing modules PM1 to PM6 based on the transfer position data, and mounts the measuring device 100 on the mounting region of the electrostatic chuck ESC. The transfer position data is coordinate data that is predetermined such that the position of the central axis AX100 of the measuring device 100 coincides with the central position of the focus ring FR. The inside of the processing module to which the measuring device 100 is transferred may be adjusted to a dehumidified vacuum environment having an ultimate vacuum level of about 10 mTorr.

The measuring device 100 may be temporarily exposed to the atmosphere while being transferred from the storage device 5 to the processing module. The measuring device 100 is exposed to the atmosphere for a period of time in which the humidity in the atmosphere does not substantially affect the measuring device 100. For example, the measuring device 100 may be exposed to the atmosphere for one hour or less.

Then, the electrostatic capacitance is measured by the measuring device 100 (step ST23). Step ST23 may be the same as steps ST1 to ST8 shown in FIG. 11, for example.

In the above-described measuring device 100, since the characteristics of the electronic components such as the variable capacitor 171c and the like are changed by the influence of humidity, an accurate measurement value cannot be obtained. In one embodiment, the measuring device 100 performs measurement in a dehumidified vacuum environment. Therefore, the resistance value of the variable resistor 171b and the electrostatic capacitance value of the variable capacitor 171c in the phase control circuit 171d are set by the parameters obtained in the same dehumidified vacuum environment. In this case, the influence of the humidity on the measurement can be eliminated by using the measuring device 100 stored in the same humidified environment as the environment in which the parameters are obtained. In one example, the influence of the humidity on the measuring device 100 is eliminated by storing the measuring device 100 in a dehumidified environment before the measuring device 100 performs the measurement. Since the measuring device 100 performs the measurement in a state where the influence of the humidity is eliminated, the accurate electrostatic capacitance can be measured.

In the processing system shown in FIG. 12, the storage device 5 is disposed near the loader module LM. However, one of the processing modules may be used as the storage device. Further, the storage device may be airtightly connected to the transfer module TF through a gate valve, similarly to the processing module. When the storage device is connected to the transfer module TF, the measuring device 100 that has been stored in the dehumidified environment can be transferred to a processing module in a dehumidified vacuum environment, after step ST21. For example, one of the containers (FOUP) that accommodate target objects W may be used as the storage device. The storage device may be separated from the processing system.

While various embodiments have been described above, various omissions, substitutions, and changes may be made without being limited to the above-described embodiments. It is also possible to combine elements in different embodiments to form other embodiments.

For example, in the description of the operation of the measuring device 100, the constants "a" and "b" are adjusted in step ST7 and step ST8. However, step ST7 and step ST8 may be omitted.

The method in which the variable resistors 171b and the variable capacitor 171c are adjusted in a state where there is no target object to be detected by the measuring device 100 has been described as an example of the method for obtaining a table for controlling the variable resistor 171b or the variable capacitor 171c. However, the method for obtaining a table for controlling the variable resistor 171b or the variable capacitor 171c is not limited thereto. For example, if a detection value outputted by each sensor under a specific condition is already known, the variable resistors 171b and the variable capacitor 171c may be adjusted such that the digital value outputted by the sensor becomes equal to the known detection value.

In the above-described example, the resistance value of the variable resistor 171b and the electrostatic capacitance value of the variable capacitor 171c are controlled to adjust the admittance of the phase control circuit 171d. In another example, the admittance may be adjusted by adjusting the amount of current flowing through the variable resistor 171b or the variable capacitor 171c. In this case, the phase control circuit 171d may include a fixed resistor and a fixed capacitor, instead of the variable resistor 171b and the variable capacitor 171c.

The embodiments of the present disclosure are illustrative in all respects and are not restrictive. The above-described embodiments can be embodied in various forms. Further, the above-described embodiments may be omitted, replaced, or changed in various forms without departing from the scope of the appended claims and the gist thereof.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

The invention claimed is:
1. A measuring device comprising:
a disc-shaped base substrate;
a plurality of sensor electrodes disposed at the base substrate;
a. temperature sensor disposed at the base substrate;
a high frequency oscillator configured to apply a high frequency signal to the sensor electrodes;
a plurality of C/V conversion circuits configured to generate a plurality of voltage signals respectively corresponding to a plurality of electrostatic capacitances of the sensor electrodes;
an A/D converter configured to convert the voltage signals outputted from the C/V conversion circuits to a plurality of digital values;
a processor;
a storage which stores a program that is read out and executed by the processor to calculate a plurality of measurement values indicating the electrostatic capacitances of the sensor electrodes, based on the digital values outputted from the A/D converter; and
a plurality of phase control circuits connected between the sensor electrodes and the high-frequency oscillator,
wherein each of the C/V conversion circuits includes an amplification circuit having an operational amplifier,
the high-frequency oscillator is connected to a non-inverting input terminal of the operational amplifier to input the high-frequency signal to the non-inverting input terminal, and is connected to an inverting input terminal of the operational amplifier through a corresponding phase control circuit among the plurality of phase control circuits, and the storage stores a plurality of parameters for setting admittances of the phase control circuits in association with a plurality of temperatures in order to adjust reference points of the voltage signals outputted from the C/V conversion circuits at the respective temperatures, and adjusts the admittances of the phase control circuits using a parameter associated with a temperature detected by the temperature sensor among the plurality of parameters.

2. The measuring device of claim 1, wherein the reference point adjustment is zero point adjustment.

3. The measuring device of claim 1, wherein the storage stores a plurality of constant groups, each including a plurality of constants associated with a plurality of temperatures, in order to suppress temperature dependence of the measurement values calculated from the digital values using a plurality of functions, and calculates the measurement values based on the functions using constants obtained from the constant groups depending on the temperature detected by the temperature sensor.

4. The measuring device of claim 2, wherein the storage stores a plurality of constant groups, each including a plurality of constants associated with a plurality of temperatures, in order to suppress temperature dependence of the measurement values calculated from the digital values using a plurality of functions, and calculates the measurement values based on the functions using constants obtained from the constant groups depending on the temperature detected by the temperature sensor.

5. A method for measuring electrostatic capacitances between a measuring device and a target object, wherein the measuring device includes:

a disc-shaped base substrate;

a plurality of sensor electrodes disposed at the base substrate;

a temperature sensor disposed at the base substrate;

a high frequency oscillator configured to apply a high frequency signal to the sensor electrodes;

a plurality of C/V conversion circuits configured to generate a plurality of voltage signals respectively corresponding to a plurality of electrostatic capacitances of the sensor electrodes;

an A/D converter configured to convert the voltage signals outputted from the C/V conversion circuits to a plurality of digital values;

a processor;

a storage which stores a program that is read out and executed by the processor to calculate a plurality of measurement values indicating the electrostatic capacitances of the sensor electrodes, based on the digital values outputted from the A/D converter; and a plurality of phase control circuits connected between the sensor electrodes and the high-frequency oscillator, wherein each of the C/V conversion circuits includes an amplification circuit having an operational amplifier, and the high-frequency oscillator is connected to a non-inverting input terminal of the operational amplifier to input the high-frequency signal to the non-inverting input terminal, and is connected to an inverting input terminal of the operational amplifier through a corresponding phase control circuit among the plurality of phase control circuits, the method comprising:

adjusting admittances of the phase control circuits using a parameter associated with a temperature detected by the temperature sensor, among a plurality of parameters that are pre-stored in association with a plurality of temperatures to set the admittances of the phase control circuits;

generating, by the C/V conversion circuits, the voltage signals in a state where the admittances are adjusted;

converting, by the A/D converter, the voltage signals outputted from the C/V conversion circuits into the digital values; and calculating the measurement values based on the digital values.

6. The method of claim 5, wherein the sensors are disposed at an edge of the base substrate, and the target object is a focus ring surrounding the base substrate.

7. The method of claim 5, wherein the sensors are disposed on a bottom surface of the base substrate, and the target object is an electrostatic chuck on which the base substrate is mounted.

8. The method of claim 5, wherein the adjusting, the generating, and the converting are performed under a dehumidified vacuum environment.

9. The method of claim 6, wherein the adjusting, the generating, and the converting are performed under a dehumidified vacuum environment.

10. The method of claim 7, wherein the adjusting, the generating, and the converting are performed under a dehumidified vacuum environment.

11. The method of claim 8, further comprising, before the adjusting, storing the measuring device under a dehumidified environment.

12. The method of claim 9, further comprising, before the adjusting, storing the measuring device under a dehumidified environment.

13. The method of claim 10, further comprising, before the adjusting, storing the measuring device under a dehumidified environment.

14. The method of claim 11, wherein after the storing, the adjusting is performed in a state where the measuring device that has been stored in the dehumidified environment is transferred to a dehumidified vacuum environment.

15. The method of claim 12, wherein after the storing, the adjusting is performed in a state where the measuring device that has been stored in the dehumidified environment is transferred to a dehumidified vacuum environment.

16. The method of claim 13, wherein after the storing, the adjusting is performed in a state where the measuring device that has been stored in the dehumidified environment is transferred to a dehumidified vacuum environment.

17. The method of claim 11, wherein in the storing, the measuring device is stored in the dehumidified environment until shortly before the adjusting is started.

18. The method of claim 12, wherein in the storing, the measuring device is stored in the dehumidified environment until shortly before the adjusting is started.

19. The method of claim 13, wherein in the storing, the measuring device is stored in the dehumidified environment until shortly before the adjusting is started.

* * * * *